(12) United States Patent
Kong et al.

(10) Patent No.: US 9,830,993 B2
(45) Date of Patent: Nov. 28, 2017

(54) STORAGE SYSTEM, HOST, STORAGE DEVICE, AND METHODS OF OPERATING SAME

(71) Applicant: SAMSUNG ELECTRONICS CO., LTD., Suwon-si, Gyeonggi-Do (KR)

(72) Inventors: Jae-Phil Kong, Seoul (KR); Hwa-Seok Oh, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/392,707

(22) Filed: Dec. 28, 2016

(65) Prior Publication Data
US 2017/0206974 A1    Jul. 20, 2017

(30) Foreign Application Priority Data

Jan. 15, 2016  (KR) .................. 10-2016-0005317

(51) Int. Cl.
| | |
|---|---|
| *G11C 16/04* | (2006.01) |
| *G11C 16/26* | (2006.01) |
| *G06F 3/06* | (2006.01) |
| *G11C 16/30* | (2006.01) |
| *H01R 12/71* | (2011.01) |
| *H01R 13/66* | (2006.01) |
| *H01R 13/70* | (2006.01) |

(52) U.S. Cl.
CPC ............ *G11C 16/26* (2013.01); *G06F 3/0625* (2013.01); *G06F 3/0629* (2013.01); *G06F 3/0658* (2013.01); *G06F 3/0679* (2013.01); *G11C 16/0483* (2013.01); *G11C 16/30* (2013.01); *H01R 12/714* (2013.01); *H01R 13/6616* (2013.01); *H01R 13/6683* (2013.01); *H01R 13/70* (2013.01)

(58) Field of Classification Search
CPC ... G11C 16/26; G11C 16/0483; G06F 3/0625; G06F 3/0629; G06F 3/0658; G06F 3/0679; H01R 12/714; H01R 13/6616; H01R 13/6683; H01R 13/70
USPC .................................................. 365/185.21
See application file for complete search history.

(56) References Cited

U.S. PATENT DOCUMENTS

| | | | |
|---|---|---|---|
| 4,964,011 A | 10/1990 | Sternglass | |
| 5,490,117 A * | 2/1996 | Oda ................. | G01R 31/31715 365/189.16 |
| 5,537,584 A | 7/1996 | Miyai et al. | |
| 5,636,347 A | 6/1997 | Muchnick et al. | |
| 5,715,207 A * | 2/1998 | Cowell ............... | G06F 13/1694 365/230.01 |
| 5,860,134 A * | 1/1999 | Cowell ............... | G06F 13/1694 365/189.03 |
| 6,944,478 B1 | 9/2005 | Durand | |

(Continued)

*Primary Examiner* — Richard Elms
*Assistant Examiner* — Xiaochun L Chen
(74) *Attorney, Agent, or Firm* — Volentine & Whitt, PLLC

(57) ABSTRACT

A storage device includes a nonvolatile memory and a connector configured to connect the storage device to a host. The connector includes a detection terminal that provides a detection voltage to the host, a sensing resistor electrically connected to the detection terminal and having a resistance value that determines the level of the detection voltage, and a power supply terminal that receives a power supply voltage from the host, wherein the power supply voltage is selected by the host in response to the detection voltage.

20 Claims, 21 Drawing Sheets

10A

(56) References Cited

U.S. PATENT DOCUMENTS

| | | |
|---|---|---|
| 6,988,222 B2 | 1/2006 | Sparer |
| 7,269,755 B2 | 9/2007 | Moshayedi et al. |
| 8,009,502 B2 | 8/2011 | Johnston et al. |
| 8,103,817 B2 | 1/2012 | Chi et al. |
| 8,172,274 B2 | 5/2012 | More et al. |
| 8,472,274 B2 | 6/2013 | Fai et al. |
| 8,504,860 B2 | 8/2013 | Trantham et al. |
| 2003/0116624 A1 | 6/2003 | Chen |
| 2005/0038956 A1 | 2/2005 | Yeh et al. |
| 2016/0033976 A1 | 2/2016 | Jung et al. |

* cited by examiner

FIG. 3

| Rs | Vdet | PWR |
|---|---|---|
| <0.1kΩ | <10mV | 1.2V |
| 10kΩ | 1V | 1.1V |
| 20kΩ | 2V | 1.0V |
| 30kΩ | 3V | 0.9V |

STORAGE SYSTEM, HOST, STORAGE DEVICE, AND METHODS OF OPERATING SAME

CROSS-REFERENCE TO RELATED APPLICATION

This application claims the benefit of Korean Patent Application No. 10-2016-0005317 filed on Jan. 15, 2016 in the Korean Intellectual Property Office, the subject matter of which is hereby incorporated by reference.

BACKGROUND

The inventive concept relates to memory devices. More particularly, the inventive concept relates to storage systems including a storage device capable of receiving a variable voltage, and a host capable of providing the variable voltage. The inventive concept also relates to methods of operating such storage systems.

A storage system includes a host and a storage device. The host and the storage device are connected to each other through any one of various standard interfaces, such as universal flash storage (UFS), serial advanced technology attachment (SATA), small computer small interface (SCSI), serial attached SCSI (SAS), and embedded multimedia card (eMMC). It is important to reduce power consumption when the storage system is used in a mobile device, and in order to reduce the power consumption, an operating voltage of the storage device should be relatively low level.

SUMMARY

According to an aspect of the inventive concept, there is provided a storage device, including a nonvolatile memory and a connector configured to connect the storage device to a host. The connector includes a detection terminal that provides a detection voltage to the host, a sensing resistor electrically connected to the detection terminal and having a resistance value that determines the level of the detection voltage, and a power supply terminal that receives a power supply voltage from the host, wherein the power supply voltage is selected by the host in response to the detection voltage.

According to an aspect of the inventive concept, there is provided a host communicating with a storage device The host includes a power management module configured to provide a power supply voltage to the storage device and includes a voltage detector configured to detect a level of a detection voltage provided by a detection terminal of the storage device, and a power supply voltage provider configured to provide the power supply voltage to a power supply terminal of the storage device, wherein a level of the power supply voltage is determined in response to the level of the detection voltage.

According to an aspect of the inventive concept, there is provided a storage system including; a storage device comprising a detection terminal providing a detection voltage, a power supply terminal receiving a power supply voltage, and a sensing resistor electrically connected to the detection terminal and having a resistance value, and a host connected to the storage device and configured to provide the power supply voltage having a level selected in response to a level of the detection voltage, wherein the level of the detection voltage is controlled by the resistance value of the sensing resistor.

According to an aspect of the inventive concept, there is provided a method of operating a storage device. The method includes; receiving a power supply voltage provided by a connected host, wherein a level of the power supply voltage is selected in response to a detection voltage provided at a detection terminal of the storage device, a level of the detection voltage being determined by a resistance value of a sensing resistor connected to the detection terminal, determining whether the power supply voltage falls within an allowable voltage range, and providing a pass signal to the host based when the power supply voltage falls within the allowable range or providing a fail signal to the host when the power supply voltage does not fall within the allowable range.

BRIEF DESCRIPTION OF THE DRAWINGS

Embodiments of the inventive concept will be more clearly understood from the following detailed description taken in conjunction with the accompanying drawings in which:

FIG. 3 is a table listing exemplary relationships associated with power supply voltages provided according to a detection voltage, according to an embodiment;

DETAILED DESCRIPTION

The inventive concept now will be described more fully hereinafter with reference to the accompanying drawings, in which embodiments are shown. This inventive concept may, however, be embodied in many different forms and should not be construed as limited to only the embodiments set forth herein. Rather, these embodiments are provided so that this disclosure will be thorough and complete, and will fully convey the scope of the invention to those skilled in the art. Throughout the written description and drawings like reference numbers and labels are used to denote like or similar elements.

Figure 1:
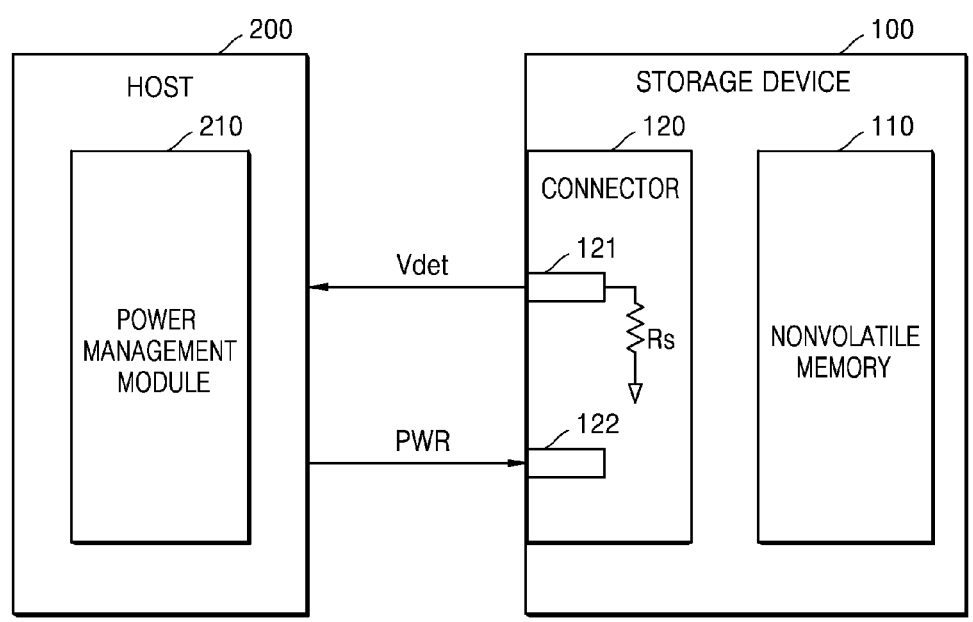
FIG. 1 is a block diagram illustrating a storage system according to an embodiment.

FIG. 1 is a block diagram illustrating a storage system 10 according to an embodiment.

Referring to FIG. 1, the storage system 10 includes a storage device 100 and a host 200. The storage system 10 may be realized as an electronic device, such as a personal computer (PC), a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device or portable navigation device (PND), an MP3 player, a handheld game console, or an e-book. Also, the storage system 10 may be realized as any one of various types of electronic devices, for example, as a wearable device such as a wrist watch or a head-mounted display (HMD).

The storage device 100 may include a nonvolatile memory 110 and a connector 120. The nonvolatile memory 110 may include a plurality of memory cells, such as flash memory cells. According to an embodiment, the plurality of memory cells may be NAND flash memory cells. However, embodiments are not limited thereto, and other embodiments may include resistive memory cells, such as resistive random access memory (ReRAM) cells, phase change RAM (PRAM) cells, or magnetic RAM (MRAM) cells.

The connector 120 illustrated in FIG. 1 includes a detection terminal 121 and a power supply terminal 122 Each of the detection terminal 121 and power supply terminal 122 is configured to be mechanically and/or electrically connectable to the host 200. In this regard, the connector 120 may be understood as a connection port or an electrical and/or mechanical interface between the host 200 and storage device 100. The term "terminal" as it relates to the detection terminal 121 and power supply terminal 122 will be understood as a conductive element providing at least an electrical signal path between the host 200 and storage device 100 when the storage device 100 is connected to the host 200. A terminal may include a pin or a pad of the type commonly used to communicate one or more electrical signals in semiconductor memory devices. Those skilled in the art will recognize that the connector 120, detection terminal 121, and/or power supply terminal 122 may be variously configured. For example, assuming that the storage device 100 is a UFS memory card, the connector 120 may be configured as UFS interconnect (UIC).

The connector 120 illustrated in FIG. 1 also includes a sensing resistor Rs electrically connected to the detection terminal 121. When the storage device 100 is connected to the host 200, the level of a detection voltage Vdet (i.e., a voltage apparent at the detection terminal 121) may be determined according to a resistance value of the sensing resistor Rs. The resistance value of the sensing resistor Rs may be differently determined based on a type of the storage device 100. Accordingly, the voltage level of the detection voltage Vdet may be differently determined based on the type of the storage device 100.

The power supply terminal 122 may receive from the host 200 a power supply voltage PWR that is determined on the basis of the detection voltage Vdet when the storage device 100 is connected to the host 200. As such, the power supply voltage PWR will have at least one level that corresponds to the voltage level of the detection voltage Vdet, that in turn, corresponds to the resistance value of the sensing resistor Rs. According to an embodiment, the power supply voltage PWR may be a multilevel voltage determined according to the resistance value of the sensing resistor Rs.

According to some embodiments, the storage device 100 may be an internal memory embedded in an electronic device. For example, the storage device 100 may be an embedded UFS memory device, an eMMC, or an SSD. However, embodiments are not limited thereto, and the storage device 100 may be a nonvolatile memory, such as a one-time programmable ROM (OTPROM), a programmable ROM (PROM), an erasable and programmable ROM (EPROM), or an electrically erasable and programmable ROM (EEPROM), a mask ROM, or a flash ROM.

According to some embodiments, the storage device 100 may be an external memory that is attachable/detachable to the host 200. For example, the storage device 100 may include at least one of a UFS memory card, a compact flash (CF) card, a secure digital (SD) card, a micro-SD card, a mini-SD card, an extreme digital (xD) card, and a memory stick.

The host 200 may be used to control data processing operations of the storage system 10, for example, data read/write operations. According to an embodiment, the host 200 may be realized as a system-on-chip (SoC), and accordingly, may be embedded in an electronic device. The host 200 may be realized as an SoC including a plurality of intellectual properties (IPs), such as a clock generator, a modem, a memory, and a display controller.

In the embodiment illustrated in FIG. 1, the host 200 may include a power management module 210. When the power management module 210 is electrically connected to the storage device 100, the power management module 210 may control the detection of the detection voltage Vdet, as well as the provision of the power supply voltage PWR, as determined according to the detection voltage Vdet, to the power supply terminal 122. For example, the power management module 210 may be realized as a power management integrated circuit (PMIC), where the PMIC is an integrated circuit (IC) capable of adjusting one or more power signals. Those skilled in the art will recognize that various PMIC have been used in mobile devices to increase a battery driving time.

Figure 2:
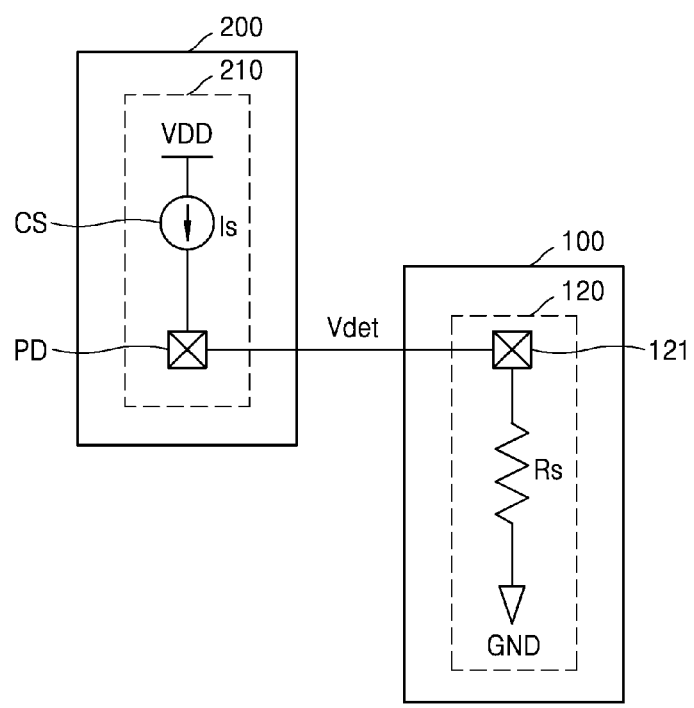
FIG. 2 is a circuit diagram further illustrating elements associated with a voltage detecting operation performed by the storage system of FIG. 1.

FIG. 2 is a circuit diagram further illustrating in one example the connector 100 and host 200 of the storage system 10 of FIG. 1 in relation to a voltage detecting operation.

Referring to FIG. 2, the storage device 100 and host 200 are electrically connected via the connector 120. Thus, the detection terminal 121 of the connector 120 may be electrically connected to a pad PD included in the power management module 210. In the illustrated embodiment of FIG. 2, the power management module 210 includes a current source CS providing a sensing current Is (e.g., 0.1 mA). With this configuration, the detection voltage Vdet apparent at the detection terminal 121 may be obtained by multiplying a resistance value R of the sensing resistor Rs and a current level I of the sensing current Is (or Vdet=R*I).

In FIG. 2, the sensing resistor Rs is connected between the detection terminal 121 and a ground terminal GND, and forms an electric path when the storage device 100 and host 200 are electrically connected. However, embodiments are not limited thereto, and the sensing resistor Rs may be an arbitrary passive device capable of forming an electric path between the storage device 100 and host 200. According to some embodiments, the sensing resistor Rs may include a plurality of resistors connected in series, in parallel, or in a combination of series and parallel. Also, according to some embodiments, at least one device may be connected between the detection terminal 121 and the sensing resistor Rs or between the sensing resistor Rs and the ground terminal GND.

FIG. 3 is a table 31 listing a set of relationships between different power supply voltages PWR, detection voltages Vdet and sensing resistances Rs according to various embodiments. However, a voltage detecting operation performed by the storage system 10 will be described in some additional detail with reference to FIGS. 1, 2 and 3, assuming a sensing current Is of 0.1 mA.

Under this assumption, when the sensing resistor Rs has a resistance value less than 0.1 kΩ, the detection voltage Vdet will be less than 10 mV, and the host 200 determines the power supply voltage PWR to be 1.2 V. Accordingly, the power management module 210 provides the power supply voltage PWR of 1.2 V to the power supply terminal 122. Assuming that the default level of the power supply voltage PWR required by the storage device 100 is 1.2 V, the sensing resistor Rs will have a resistance value less than 0.1 kΩ. This resistance level may be realizable by parasitic resistance(s) of elements used in the voltage detection operation.

However, assuming that the sensing resistor Rs has a resistance value of 10 kΩ, the detection voltage Vdet will be 1.0 V, and the host 200 will determine the power supply voltage PWR to be 1.1 V. Accordingly, the power management module 210 will provide the power supply voltage PWR of 1.1 V to the power supply terminal 122. Assuming that the sensing resistor Rs has a resistance value of 20 kΩ, the detection voltage Vdet will be 2.0 V, and the host 200 will determine the power supply voltage PWR to be 1.0 V. Accordingly, the power management module 210 will provide the power supply voltage PWR of 1.0 V to the power supply terminal 122. And assuming that the sensing resistor Rs has a resistance value of 30 kΩ, the detection voltage Vdet will be 3.0 V, and the host 200 will determine the power supply voltage PWR to be 0.9 V. Accordingly, the power management module 210 may provide the power supply voltage PWR of 0.9 V to the power supply terminal 122.

Thus, the embodiments illustrated in FIGS. 1, 2 and 3 shows that the host 200 may provide the power supply voltage PWR (or a multilevel power supply voltage PWR) having a level that varies with the resistance of the sensing resistor Rs to the power supply terminal 122 of the storage device 100. According to FIG. 3, as the resistance value of the sensing resistor Rs included in the storage device 100 increases, the level of the power supply voltage PWR provided to the storage device 100 decreases. However, embodiments are not limited thereto, and the power supply voltage PWR provided to the storage device 100 may increase as the resistance value of the sensing resistor Rs included in the storage device 100 increases.

Also, according to the embodiment of FIG. 3, the resistance value of the sensing resistor Rs may be determined to be less than 0.1 kΩ or approximately equal to 10 kΩ, 20 kΩ, or 30 kΩ, but these are just selected examples of possible resistance values for the sensing resistor Rs. Any reasonable number and/or range of resistance values for the sensing resistor Rs may be used so that the host 200 may determine a corresponding level of the power supply voltage PWR based on the detection voltage Vdet according to the resistance value of the sensing resistor Rs.

Given the foregoing it should be noted that the level of the detection voltage Vdet may be errantly detected (i.e., a detection error). Under such conditions, the host 200 may provide the power supply voltage PWR having a level that is not appropriate to the operating conditions or specifications of the storage device 100. However, the possibility of a detection error occurring may be reduced by setting sufficiently large differences between resistance values for the sensing resistor Rs.

Figure 4:
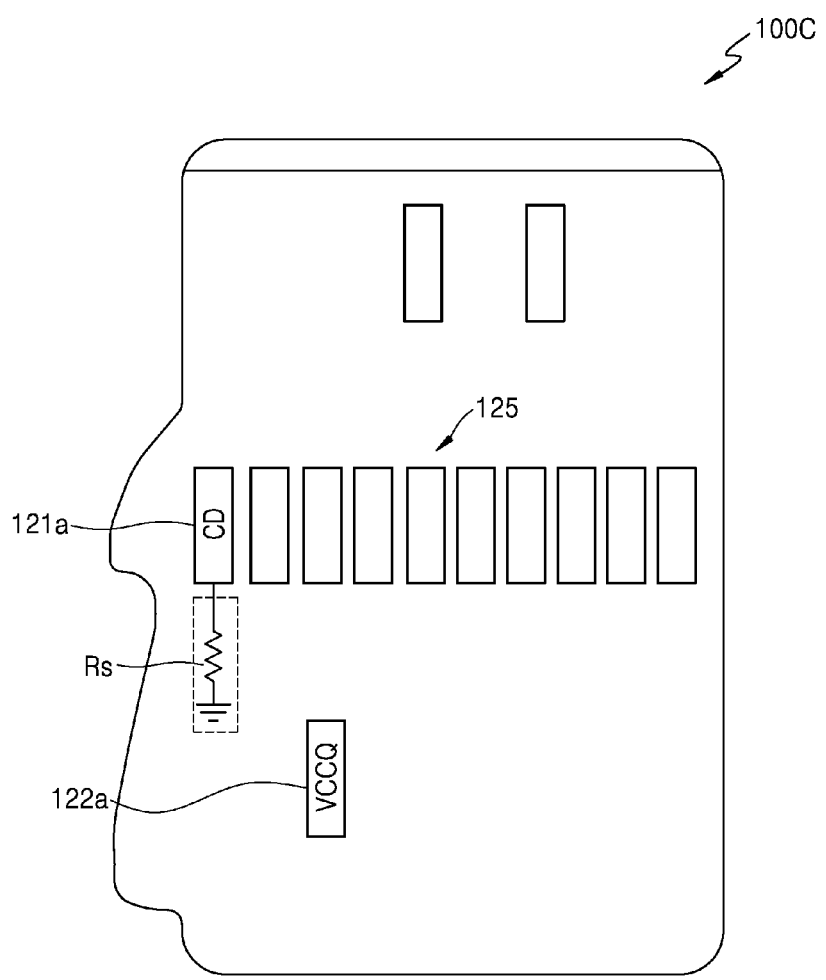
FIG. 4 illustrates connection pins provided on one surface of a storage device, according to an embodiment.

FIG. 4 is a partial plan view illustrating a storage device 100C including a plurality of connection pins 125 according to an embodiment, where the plurality of connection pins 125 is provided on one surface of the storage device 100C and includes a card detection pin 121a and a power supply pin 122a. Thus, the embodiment illustrated in FIG. 4 shows the card detection pin 121a as an example of the detection terminal 121 of FIG. 1, and the power supply pin 122a as an example of the power supply terminal 122 of FIG. 1. In some embodiments, the plurality of connection pins 125 may include multiple power supply pins, where at least one of the multiple power supply pins receives a power supply voltage having a level different from that received by the power supply pin 122a. In some embodiments, the plurality of connection pins 125 may variously include one or more input pins, output pins, and/or input/output (I/O) pins.

In the embodiment illustrated in FIG. 4, the sensing resistor Rs is provided internal to the storage device 100C and is electrically connected to the card detection pin 121a. For example, the sensing resistor Rs may be connected between the card detection pin 121a and a ground terminal to form an electrical path when the storage device 100C is connected to a host (e.g., the host 200 of FIG. 1). However, embodiments are not limited thereto, and in some embodiments, at least one device may be connected between the card detection pin 121a and the sensing resistor Rs, or between the sensing resistor Rs and the ground terminal.

The number, respective size, and/or arrangement of the plurality of connection pins 125 included in the storage device 100C will vary according to embodiments. For example, the nature of an interface protocol used by the storage device 100C may determine, at least in part, the number, size and/or arrangement of the plurality of connection pins. In this regard, the storage device 100C and the host 200 of FIG. 1 may communicate using one or more interface protocols, including advanced technology attachment (ATA), serial ATA (SATA), external SATA (e-SATA), parallel ATA (PATA), small computer small interface (SCSI), serial attached SCSI (SAS), peripheral component interconnection (PCI), PCI express (PCI-E), IEEE 1394, universal serial bus (USB), enhanced small device interface (ESDI), integrated drive electronics (IDE), secure digital (SD) card, multimedia card (MMC), embedded MMC (eMMC), universal flash storage (UFS), and compact flash (CF) card interfaces.

Figure 5:
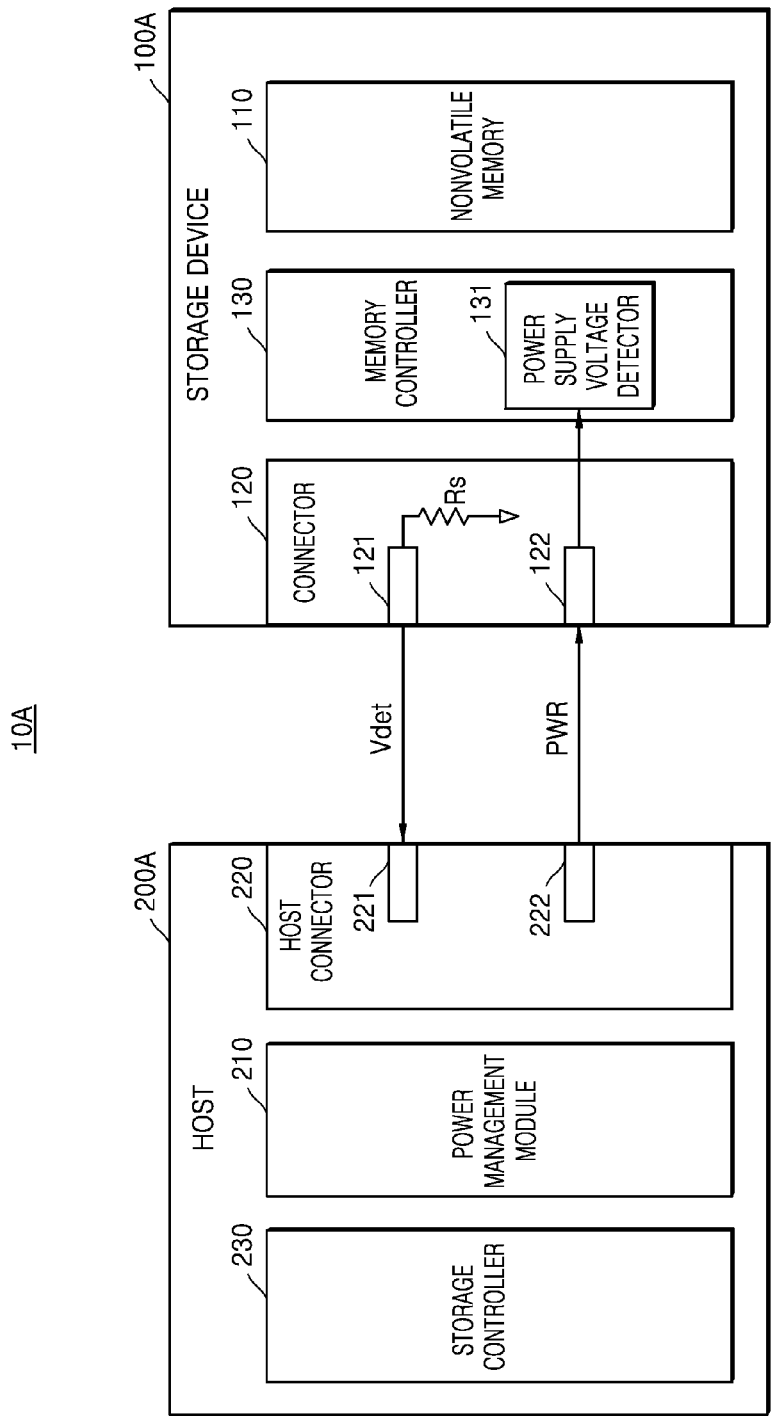
FIG. 5 is a block diagram illustrating in detail a storage system according to an embodiment.

FIG. 5 is a block diagram illustrating a storage system 10A according to an embodiment.

Referring to FIG. 5, the storage system 10A may include the storage device 100A and a host 200A. The host 200A may include the power management module 210, a host connector 220, and a storage controller 230. According to an embodiment, the power management module 210 and the storage controller 230 may be realized as a SoC, and accordingly, may be embedded in an electronic device. According to an embodiment, the power management module 210 and the storage controller 230 may be realized by the functionality/resources provided by an application processor (AP). The power management module 210 may be realized similar to the power management module 210 of FIG. 1.

The host connector 220 may include first and second connection terminals 221 and 222 configured to connect with one or more elements of the storage device 100A. For example, the first and second connection terminals 221 and 222 may be realized as conductive terminals (e.g., pins or pads) capable of communicating electrical signals with elements(s) of the storage device 100A. For example, assuming that the storage device 100A is a UFS memory card, the host connector 220 may be a UIC.

The first connection terminal 221 may be electrically connected to the detection terminal 121 of the storage device 100A. Accordingly, the power management module 210 may determine a voltage level of the first connection terminal 221 to be the detection voltage Vdet. The first connection terminal 221 may be electrically connected to the pad PD of FIG. 2. The second connection terminal 222 may be electrically connected to the power supply terminal 122 of the storage device 100A. Accordingly, the power management module 210 may provide the power supply voltage PWR to the power supply terminal 122 of the storage device 100A through the second connection terminal 222.

The storage controller 230 is a block capable of functionally interfacing with the storage device 100A. For example, the storage controller 230 may issue request(s) (e.g., read/write requests) to the storage device 100A, and receive corresponding response(s). Also, the storage controller 230 may transmit data to be stored in the storage device 100A, and receive data read from the storage device 100A. The storage controller 230 may be a host controller, a static memory controller (SMC), or a flash memory controller (FMC).

According to an embodiment, the storage controller 230 may select the power supply voltage PWR based on the detection voltage Vdet. As described above in relation to FIG. 3, the level of the power supply voltage PWR may be varied according to the level of the detection voltage Vdet. Here, the storage controller 230 may control the power management module 210 to provide the power supply voltage PWR selected according to the detection voltage Vdet. However, embodiments are not limited thereto, and a processor of the host 200A may select the power supply voltage PWR according to the detection voltage Vdet. Here, the processor may control the power management module 210 to provide the selected power supply voltage PWR.

The storage device 100A of FIG. 5 may include the nonvolatile memory 110, the connector 120, and a memory controller 130, wherein the memory controller 130 may include a power supply detector 131. The nonvolatile memory 110 and connector 120 of FIG. 5 may be similar to those described in relation to FIG. 1. The memory controller 130 may control the nonvolatile memory 110 to read/write data in response to a read/write request(s) received from the host 200A. According to an embodiment, the power supply voltage PWR received by the power supply terminal 122 may be a power supply voltage used by the memory controller 130.

The power supply voltage detector 131 may be used to detect the power supply voltage PWR to determine whether the power supply voltage PWR received by the power supply terminal 122 corresponds to a target voltage. Also, the power supply voltage detector 131 may transmit a pass/fail signal to the host 200A based on the results of this determination. However, embodiments are not limited thereto, and another functional block of the memory controller 130 (e.g., a processor) may receive the determination results of the power supply voltage detector 131, and transmit the pass/fail signal to the host 200A.

According to an embodiment, the power supply voltage detector 131 may determine whether a level of the power supply voltage PWR falls within an allowable range. The allowable range may be defined by a first reference voltage less than or equal to a target voltage and a second reference voltage greater than or equal to the target voltage. For example, the first reference voltage may be set as (the target voltage −0.05 V) and the second reference voltage may be set to be (target voltage +0.05 V). Using this approach, the possibility of providing an errant power supply signal in response to a detection error is markedly reduced.

Figure 6:
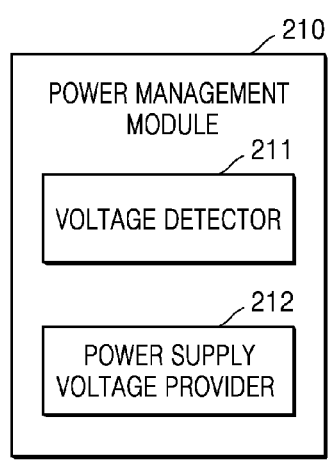
FIG. 6 is a block diagram illustrating in detail a power management module of FIG. 5.

FIG. 6 is a block diagram further illustrating in one example the power management module 210 of FIG. 5. Hereinafter, a power supply voltage providing operation of the storage system 10A according to an embodiment will be described with reference to FIGS. 5 and 6.

Referring to FIGS. 5 and 6, the power management module 210 may include a voltage detector 211 and a power supply voltage provider 212. The voltage detector 211 provides a sensing current to the first connection terminal 221 of the host connector 220, and may detect a voltage provided by the first connection terminal 221 which is electrically connected to the detection terminal 121 of the storage device 100A as the detection voltage Vdet. The voltage level of the detection terminal 121 of the storage device 100A may be determined according to a resistance value of the sensing resistor Rs according to the sensing current, and since the voltage level of the detection terminal 121 is the same as that of the first connection terminal 221, the voltage detector 211 may detect the voltage level of the first connection terminal 221 as the detection voltage Vdet.

According to the embodiment illustrated in FIG. 6, the voltage detector 211 may provide the detection voltage Vdet to the storage controller 230, and the storage controller 230 may determine a voltage level of the power supply voltage PWR to be provided to the storage device 100A based on the detection voltage Vdet. Also, the storage controller 230 may provide a control signal according to the power supply voltage PWR to the power supply voltage provider 212.

The power supply voltage provider 212 may generate the power supply voltage PWR in response to the control signal received from the storage controller 230, and provide the generated power supply voltage PWR to the storage device 100A through the second connection terminal 222. One possible approach to the operation of the power supply voltage provider 212 will be described in some additional with reference to FIG. 7.

Figure 7:
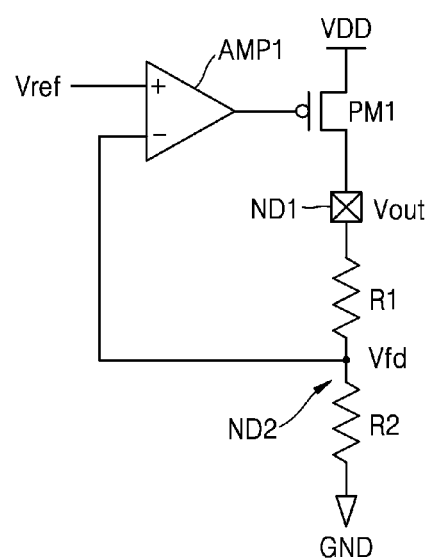
FIG. 7 is a circuit diagram showing a power supply voltage provider according to an embodiment.

FIG. 7 is a circuit diagram illustrating in one example 212a the power supply voltage provider 212 of FIG. 6 according to an embodiment.

Referring to FIG. 7, the power supply voltage provider 212a includes an operating amplifier AMP1, a transistor PM1, and first and second resistors R1 and R2. The power supply voltage provider 212a may be realized as a low drop out (LDO) regulator. However, the power supply voltage provider 212 is not limited thereto, and the power supply voltage provider 212 may have an arbitrary structure for providing a determined power supply voltage.

The transistor PM1 includes a gate connected to an output terminal of the operating amplifier AMP1, a source that receives an input voltage VDD, and a drain connected to a first node ND1. The first resistor R1 is connected between the first node ND1 and a second node ND2. The second resistor R2 is connected between the second node ND2 and the ground terminal GND. A reference voltage Vref is applied to a first input terminal of the operating amplifier AMP1, and a second input terminal of the operating amplifier AMP1 is connected to the second node ND2.

An output voltage Vout of the first node ND1 may be the power supply voltage PWR provided by the power supply voltage provider 212a, and may be provided to the power supply terminal 122 of the storage device 100A through the second connection terminal 222. A feedback voltage Vfd of the second node ND2 may have a voltage level obtained by proportionally dividing the output voltage Vout across the first and second resistors R1 and R2. The operating amplifier AMP1 may be used to compare the reference voltage Vref and the feedback voltage Vfd, and amplify a comparison result to provide an output signal. Accordingly, the power supply voltage provider 212a may provide the output voltage Vout following a voltage level of the reference voltage Vref based on the input voltage VDD.

Referring to FIGS. 5 and 7, the host 200A may determine the power supply voltage PWR based on the detection voltage Vdet according to the resistance value of the sensing resistor Rs, and the power supply voltage provider 212a of the power management module 210 may generate a control signal proportionality adjusting the voltage drops across the first and second resistors R1 and R2 according to the power supply voltage PWR such that the power supply voltage PWR is generated. The power supply voltage provider 212a may output the output voltage Vout corresponding to the power supply voltage PWR to the first node ND1, according to the proportionality of voltage drops across the first and second resistors R1 and R2 adjusted based on the control signal.

Figure 8:
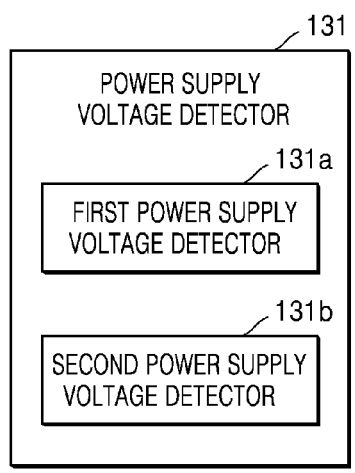
FIG. 8 is a block diagram illustrating in detail a power supply voltage detector of FIG. 5.

FIG. 8 is a block diagram further illustrating in one embodiment the power supply voltage detector 131 of FIG. 5. Hereinafter, operations of the power supply voltage detector 131 will be described in detail with reference to FIGS. 5 and 8. The power supply voltage detector 131 may be used to detect the power supply voltage PWR to determine whether the power supply voltage PWR received by the power supply terminal 122 corresponds to the target voltage, and may include a first power supply voltage detector 131a and a second power supply voltage detector 131b.

The first power supply voltage detector 131a may determine whether the power supply voltage PWR received by the power supply terminal 122 is greater than or equal to a first reference voltage, wherein the first reference voltage may be set to be less than or equal to the target voltage (e.g., target voltage −0.05 V). The second power supply voltage detector 131b may determine whether the power supply voltage PWR received by the power supply terminal 122 is less than or equal to a second reference voltage level, wherein the second reference voltage level may be set to be greater than or equal to the target voltage (e.g., target voltage +0.05 V).

Figure 9A:
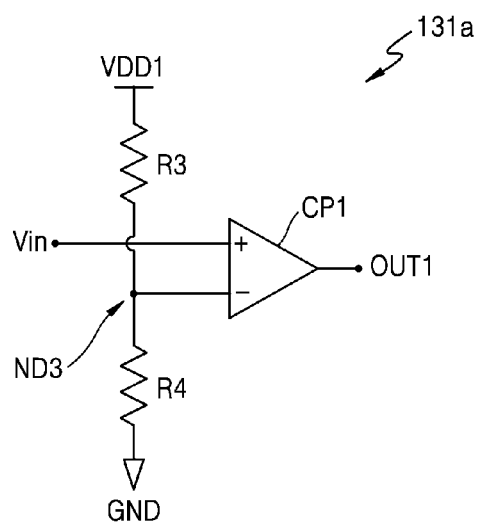
FIGS. 9A and 9B are circuit diagrams respectively showing first and second power supply voltage detectors of FIG. 8.

FIG. 9A is a circuit diagram further illustrating in one example the first power supply voltage detector 131a of FIG. 8. Hereinafter, operations of the first power supply voltage detector 131a will be described with reference to FIGS. 5, 8, and 9A. The first power supply voltage detector 131a may include third and fourth resistors R3 and R4, and a comparator CP1.

In FIG. 9A, the third resistor R3 is connected between a first voltage terminal VDD1 and a third node ND3, and the fourth resistor R4 is connected between the third node ND3 and the ground terminal GND. A voltage of the third node ND3 may have a voltage level obtained by dividing the first voltage terminal VDD1 by the proportionality of voltage drops across the third and fourth resistors R3 and R4. Here, the voltage level of the first voltage terminal VDD1 and resistance values of the third and fourth resistors R3 and R4 may be determined such that a voltage of the third node ND3 corresponds to the first reference voltage.

A voltage Vin received from the power supply terminal 122 is input to a first input terminal of the comparator CP1, and a voltage of the third node ND3 is applied to a second input terminal of the comparator CP1. The comparator CP1 compares the voltage Vin received by the power supply terminal 122 and the voltage of the third node ND3, and output a comparison result as a first output signal OUT1. Here, the voltage Vin received by the power supply terminal 122 may correspond to the power supply voltage PWR, and the voltage of the third node ND3 may correspond to the first reference voltage.

Figure 9B:
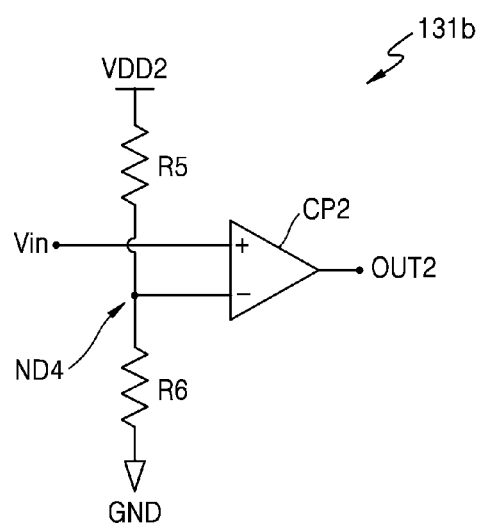

FIG. 9B is a circuit diagram further illustrating in one example the second power supply voltage detector 131b of FIG. 8. Hereinafter, operations of the second power supply voltage detector 131b will be described with reference to FIGS. 5, 8, and 9B. The second power supply voltage detector 131b may include fifth and sixth resistors R5 and R6, and a comparator CP2.

In FIG. 9B, the fifth resistor R5 is connected between a second voltage terminal VDD2 and a fourth node ND4, and the sixth resistor R6 is connected between the fourth node ND4 and the ground terminal GND. A voltage of the fourth node ND4 will have a level obtained by dividing a voltage level of the second voltage terminal VDD2 by the proportionality of voltage drops across the fifth and sixth resistors R5 and R6. Here, the voltage level of the second voltage terminal VDD2 and resistance values of the fifth and sixth resistors R5 and R6 may be determined such that the voltage of the fourth node ND4 corresponds to the second reference voltage.

The voltage Vin received by the power supply terminal 122 is input to a first input terminal of the comparator CP2, and a voltage of the fourth node ND4 is applied to a second input terminal of the comparator CP2. The comparator CP2 compares the voltage Vin received by the power supply terminal 122 and the voltage of the fourth node ND4, and output a comparison result as a second output signal OUT2. Here, the voltage Vin received by the power supply terminal 122 may correspond to the power supply voltage PWR, and the voltage of the fourth node ND4 may correspond to the second reference voltage.

As shown in FIGS. 9A and 9B, the power supply voltage detector 131 may include the first and second power supply voltage detectors 131a and 131b, but embodiments are not limited thereto. In some embodiments, the power supply voltage detector 131 may only include the first power supply voltage detector 131a, where the first power supply voltage detector 131a sequentially performs first and second detecting operations by varying the level of the first voltage terminal VDD1.

Referring to FIGS. 5, 9A, and 9B, the power supply voltage detector 131 may determine whether the power supply voltage PWR received by the power supply terminal 122 falls within an allowable range based on the first and second output signals OUT1 and OUT2. When it is determined that the power supply voltage PWR falls within the allowable range, an initialization process of the storage device 100A may be successfully performed. Here, the storage device 100A may set an initialization completion flag to a first level (e.g., reset), and transmit the initialization completion flag to the host 200A. The initialization completion flag set to the first level indicates that the storage device 100A is ready to receive an arbitrary command from the host 200A. For example, a 'fDeviceInit' flag may be used as the initialization completion flag.

However, when it is determined that the power supply voltage PWR does not fall within the allowable range, the initialization process of the storage device 100A is deemed to have failed. Here, the storage device 100A may set the initialization completion flag to a second level, and transmit the initialization completion flag to the host 200A. The initialization completion flag set to the second level indicates that that the storage device 100A is not ready to receive an arbitrary command from the host 200A.

Figure 10:
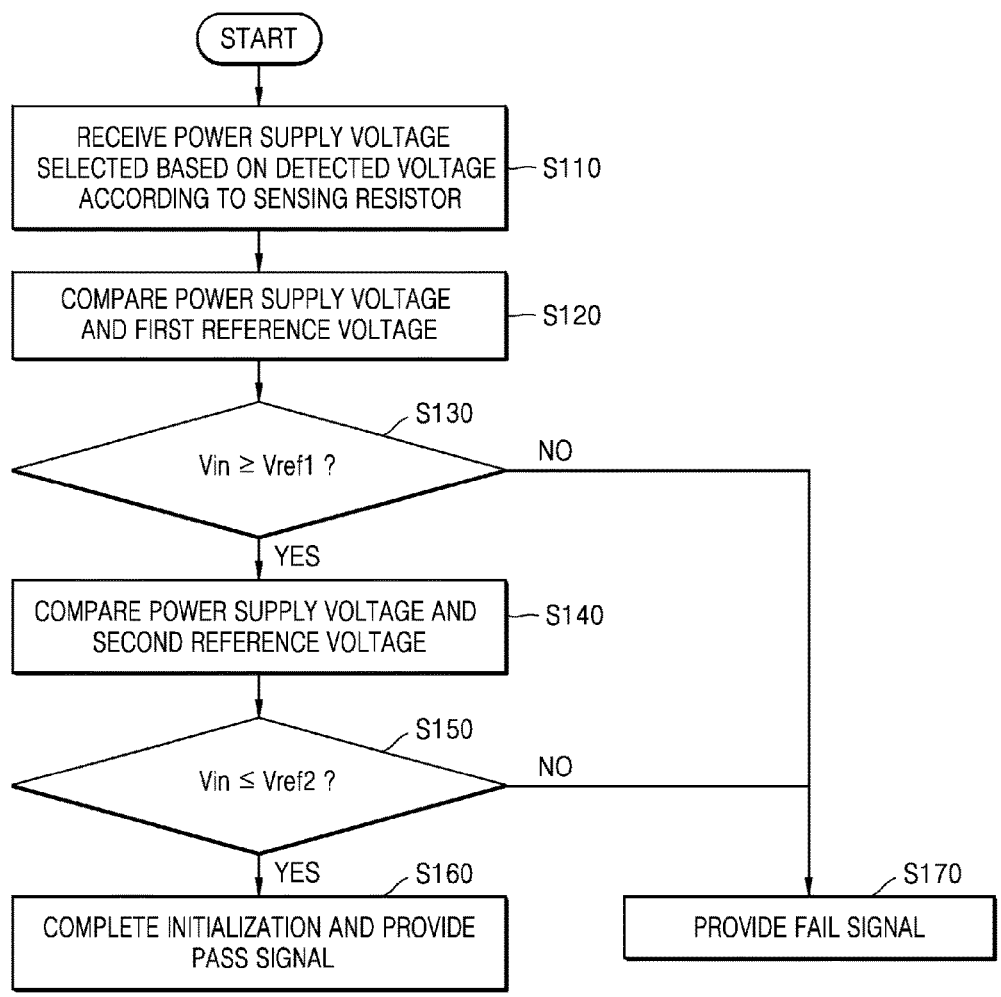
FIG. 10 is a flowchart of a method of receiving, by a storage device, a power supply voltage, according to an embodiment.

FIG. 10 is a flowchart summarizing a method whereby a storage device like the one previously described receive a power supply voltage from an external device like the host previously described according to an embodiment. Hence, in certain embodiments, the illustrated method may include operations performed in time-series by the storage device 100A of FIG. 5. The description that follows is made with this assumption and reference to FIGS. 5, 9A and 10.

In operation S110, the voltage Vin selected based on the detection voltage Vdet according to the sensing resistor Rs is received. When the storage device 100A is electrically connected to the host 200A, a sensing current is applied to the detection terminal 121, and accordingly, the detection voltage Vdet of the detection terminal 121 is determined according to the sensing resistor Rs. The host 200A may determine power supply voltage to be provided to the storage device 100A based on the detection voltage Vdet, and the power management module 210 may provide the determined power supply voltage to the storage device 100A.

In operation S120 (e.g., a first detecting operation), the voltage Vin and a first reference voltage Vref1 are compared. For example, the first reference voltage Vref1 may have a level less than a target voltage by 0.05 V. In operation S130, it is determined whether the voltage Vin is greater than or equal to the first reference voltage Vref1. When it is determined that the voltage Vin is greater than or equal to the first reference voltage Vref1 (S130=YES), operation S140 is performed, else operation S170 is performed.

In operation S140 (e.g., a second detecting operation), the voltage Vin is compared with a second reference voltage Vref2. For example, the second reference voltage Vref2 may have a level higher than the target voltage by 0.05 V. In operation S150, it is determined whether the voltage Vin is less than or equal to the second reference voltage Vref2. When it is determined that the voltage Vin is less than or equal to the second reference voltage Vref2, operation S160 is performed, else operation S170 is performed.

In operation S160, initialization of the storage device 100A is completed and a pass signal is provided to the host 200A. For example, when the voltage Vin greater than or equal to the first reference voltage Vref1 and less than or equal to the second reference voltage Vref2, the storage device 100A determines that the voltage Vin is within an allowable range, and completes connection initialization with the host 200A. Then, the storage device 100A may provide a pass signal to the host 200A.

In operation S170, the initialization of the storage device 100A is deemed to have failed and a fail signal is provided to the host 200A. For example, when the voltage Vin is less than the first reference voltage Vref1 or greater than the second reference voltage Vref2, the storage device 100A determines that the voltage Vin is not within the allowable and may provide a fail signal to the host 200A.

Figure 11:
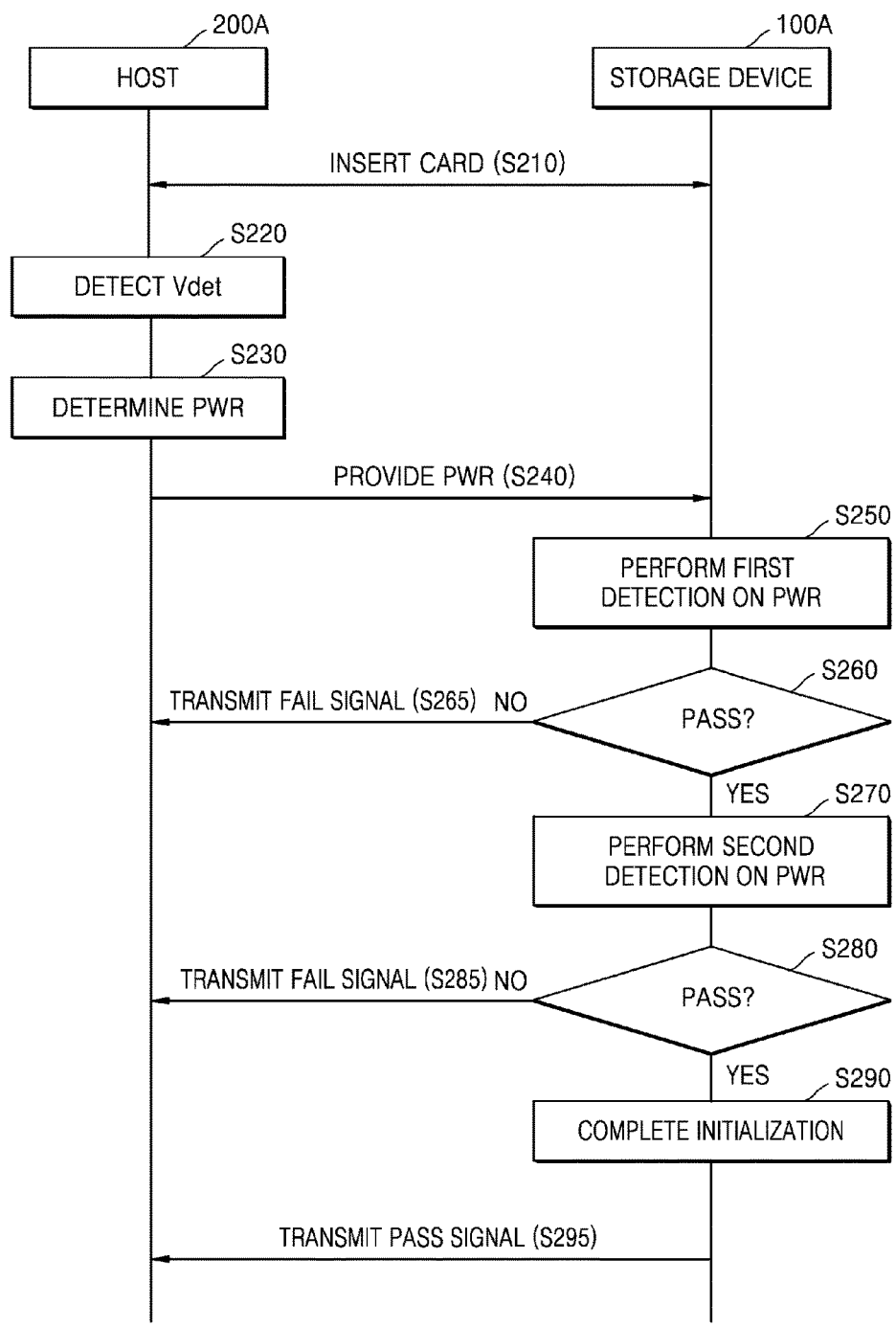
FIG. 11 is a flowchart of a method of providing, to a storage system, a power supply voltage, according to an embodiment.

FIG. 11 is an operational diagram illustrating a method of providing a multilevel power supply voltage from a host 200A to a storage device 100A of a storage system according to an embodiment. The assumptions and descriptive context used in relation to FIG. 10 are used in relation to FIG. 11, except reference is made to FOGS. 5, 9B and 11.

In operation S210, the storage device 100A and the host 200A are assumed to be electrically connected by card insertion. That is, the storage device 100A is assumed to be an attachable/detachable external memory, wherein connection is established by inserting the storage device 100A into the host 200A. However, embodiments are not limited thereto, and in some embodiments, the storage device 100A may be an internal memory embedded in the electronic device.

In operation S220, the host 200A detects the detection voltage Vdet. Here, the detection voltage Vdet has a voltage level of the detection terminal 121 according to a resistance value of the sensing resistor Rs connected to the detection terminal 121 of the storage device 100A.

In operation S230, the host 200A determines the power supply voltage PWR to be provided to the storage device 100A based on the detection voltage Vdet.

In operation S240, the host 200A provides the power supply voltage PWR to the storage device 100A.

In operation S250, the storage device 100A performs first detection on the power supply voltage PWR. Here, the first detection may be performed by comparing the power supply voltage PWR and a first reference voltage that is equal to or lower than a target voltage.

In operation S260, it is determined whether the first detection succeeded. When it is determined that the first detection has succeeded, operation S270 is performed, else operation S265 is performed.

In operation S265, the storage device 100A transmits a fail signal to the host 200A.

In operation S270, the storage device 100A performs second detection on the power supply voltage PWR. Here, the second detection may be performed by comparing the power supply voltage PWR and a second reference voltage that is equal to or higher than the target voltage.

In operation S280, it is determined whether the second detection has succeeded. When it is determined that the second detection has succeeded, operation S290 is performed, else operation S285 is performed.

In operation S285, the storage device 100A transmits a fail signal to the host 200A.

In operation S290, initialization of the storage device 100A is completed.

In operation S295, the storage device 100A transmits a pass signal to the host 200A.

Figure 12:
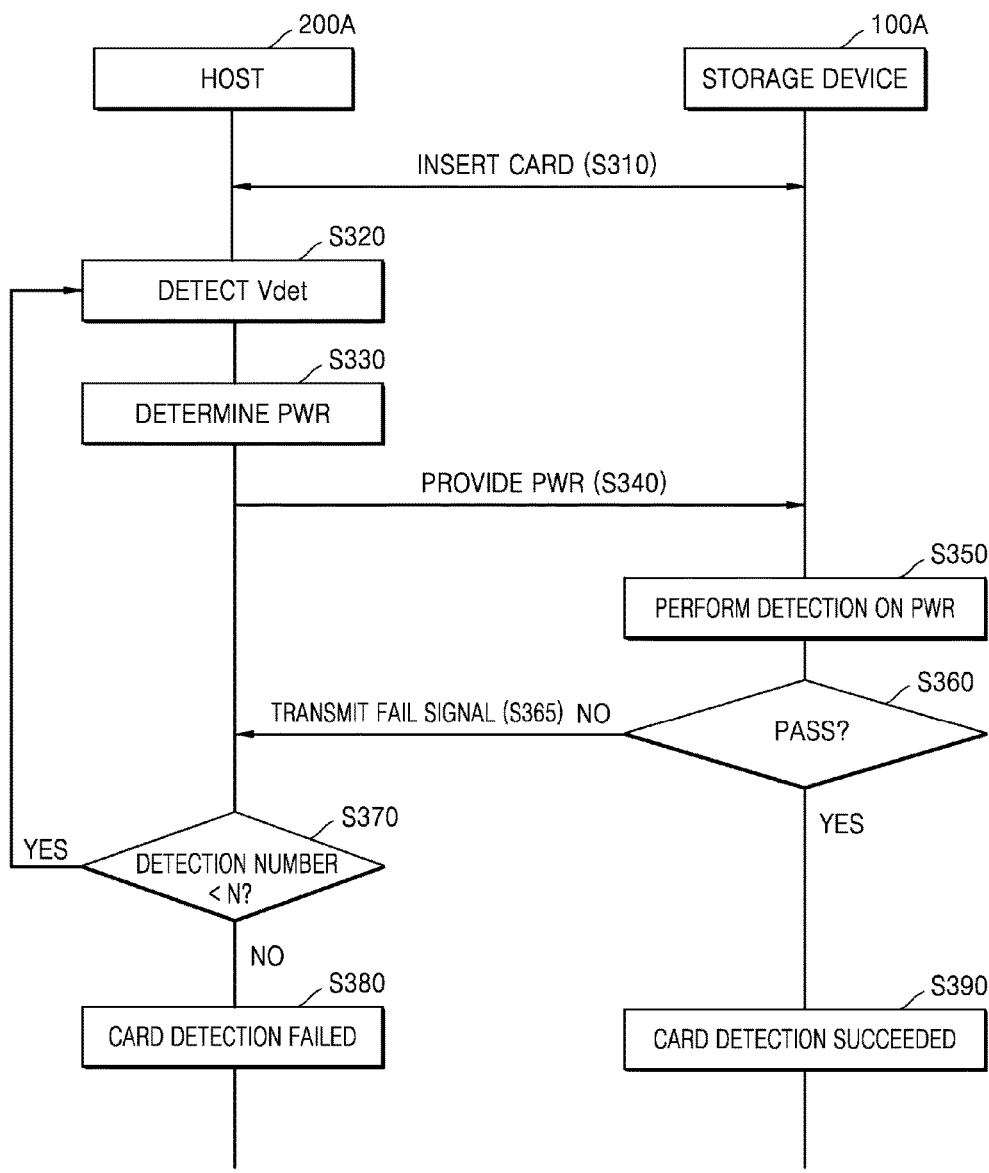
FIG. 12 is a flowchart of a method of providing, to a storage system, a power supply voltage, according to an embodiment.

FIG. 12 is another operational diagram illustrating a method of providing a multilevel power supply voltage from a host 200A to a storage device 100A of a storage system according to an embodiment. The assumptions and descriptive context used in relation to FIG. 11 are used in relation to FIG. 12.

In operation S310, the storage device 100A and the host 200A are again assumed to be electrically connected through card insertion.

In operation S320, the host 200A detects the detection voltage Vdet. Here, the detection voltage Vdet has a voltage level of the detection terminal 121 according to a resistance value of the sensing resistor Rs connected to the detection terminal 121 of the storage device 100A.

In operation S330, the host 200A determines the power supply voltage PWR to be provided to the storage device 100A based on the detection voltage Vdet.

In operation S340, the host 200A provides the power supply voltage PWR to the storage device 100A.

In operation S350, the storage device 100A performs detection on the power supply voltage PWR. Here, the detection may be performed by determining whether the power supply voltage PWR is within an allowable range.

In operation S360, it is determined whether the detection has succeeded. When it is determined that the detection has succeeded, operation S390 is performed. In operation S390, card detection succeeded. However, when it is determined that the detection has failed, operation S365 is performed. In operation S365, the storage device 100A transmits a fail signal to the host 200A.

In operation S370, the host 200A determines whether a number of times that the detection voltage Vdet has been detected as being less than a pre-set threshold number N. So long as the number of times remains less than the pre-set threshold number N, operation S320 is performed. As such, by repeatedly detecting the detection voltage Vdet, the possibility of a detection error is reduced, thereby reducing a number of errors that may result in providing a wrong power supply voltage to the storage device 100A. However, when it is determined that the number of times is greater than the pre-set threshold number N, operation S380 is performed and the card detection is deemed to have failed.

Figure 13:
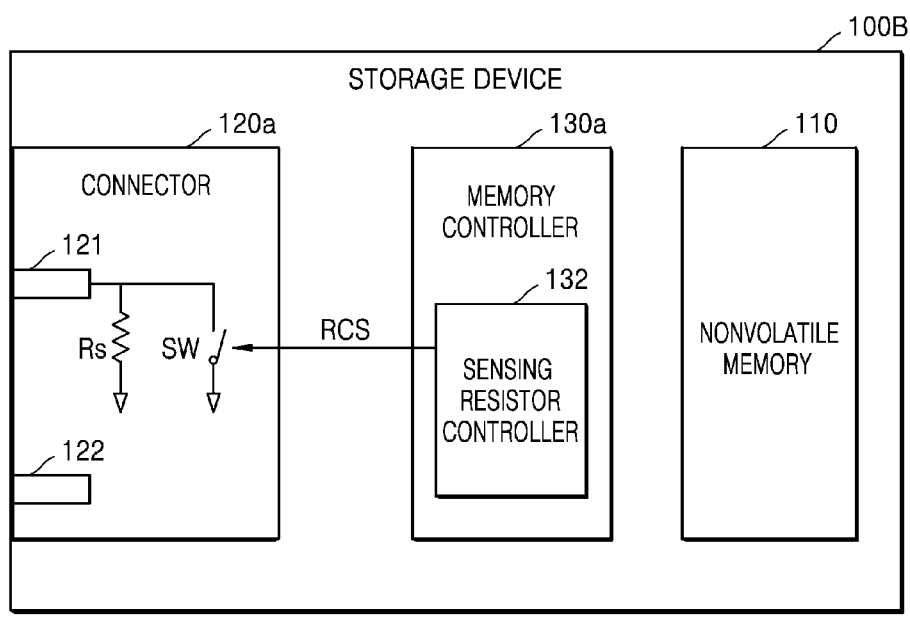
FIG. 13 is a block diagram of a storage device according to an embodiment.

FIG. 13 is a block diagram illustrating in another example (100B) the storage device 100 of FIG. 1 and/or the storage device 100A of FIG. 5 according to an embodiment.

Referring to FIG. 13, the storage device 100B includes the nonvolatile memory 110, a connector 120a, and a memory controller 130a.

The connector 120a includes the detection terminal 121, power supply terminal 122, and sensing resistor Rs. However, a switch SW is added and connected between the memory controller 130a, more particularly a sensing resistor controller 132 of the memory controller 130a, and the sensing resistor Rs. The sensing resistor controller 132 may be used to generate a resistance control signal RCS according to a voltage level of a power supply voltage received at the power supply terminal 122. That is, the switch SW may be turned ON/OFF by the resistance control signal RCS.

According to an embodiment, when a level of the power supply voltage received at the power supply terminal 122 is at least the default voltage level (e.g., 1.2 V), the sensing resistor controller 132 may activate the resistance control signal RCS. Accordingly, the switch SW is turned ON and the detection terminal 121 is connected to a ground terminal. Alternately, if the level of the power supply voltage received at the power supply terminal 122 is less than the default level, the sensing resistor controller 132 may deactivate the resistance control signal RCS. Accordingly, the switch SW is turned OFF and the detection terminal 121 is connected to the sensing resistor Rs. In this case, the detection voltage Vdet of the detection terminal 121 may increase according to a resistance value of the sensing resistor Rs, and a host (for example, the host 200A of FIG. 5) may provide a variable power supply voltage to the power supply terminal 122 according to the detection voltage Vdet.

As such, according to the embodiment illustrated in FIG. 13, the connector 120a further includes the switch SW connected in parallel with the sensing resistor Rs, where the switch SW is turned ON/OFF in response to a desired power supply voltage level. Accordingly, the power supply terminal 122 may receive a variable voltage level, and performance of the storage device 100B may be further increased.

Figure 14:
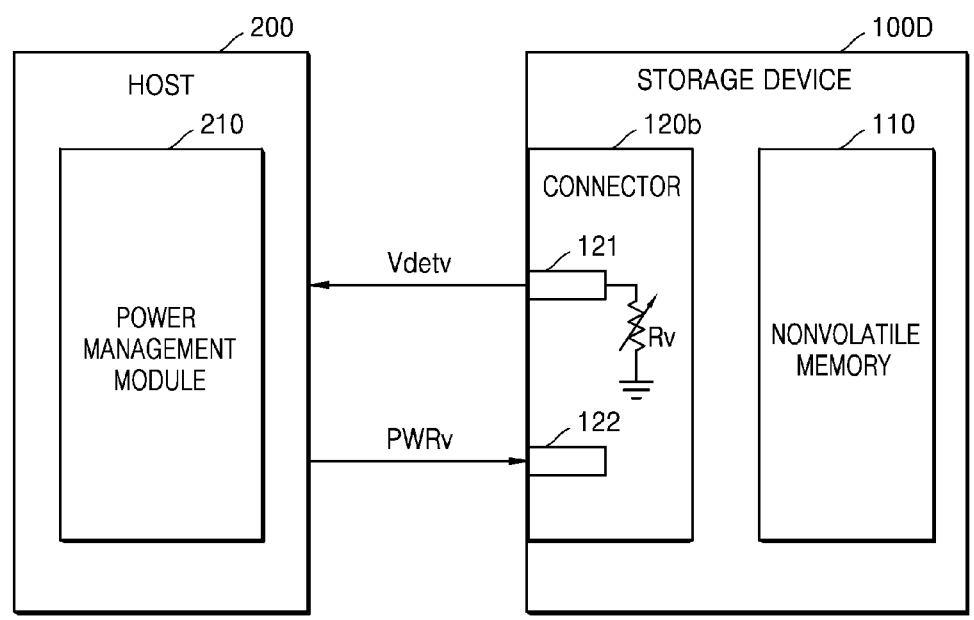
FIG. 14 is a block diagram schematically illustrating a storage system according to an embodiment.

FIG. 14 is a block diagram illustrating a storage system 10B according to an embodiment.

Referring to FIG. 14, the storage system 10B includes a storage device 100D and the host 200. The storage system 10B is a modified version of the storage system 10 of FIG. 1, and details described above with reference to FIG. 1 may be applied to the storage system 10B.

The storage device 100D includes the nonvolatile memory 110 and a connector 120b, where the connector 120b includes the detection terminal 121 and power supply terminal 122. As before, these terminals are connectable to an external device, such as the host 200. However, in the illustrated embodiment of FIG. 14, the connector 120b further includes a variable sensing resistor Rv electrically connected to the detection terminal 121.

When the storage device 100D is electrically connected to the host 200, a variable detection voltage Vdetv (i.e., the voltage apparent at the detection terminal 121) are varied according to the resistance value of the variable sensing resistor Rv. The resistance value of the variable sensing resistor Rv may be varied after the storage device 100D and the host 200 are connected or during operation of the storage device 100D.

When the storage device 100D and the host 200 are electrically connected, the power supply terminal 122 receives a variable power supply voltage PWRv selected in response to the variable detection voltage Vdetv. As such, the variable power supply voltage PWRv may have a variable voltage level corresponding to the voltage level of the variable detection voltage Vdetv that in turn is determined by the resistance value of the variable sensing resistor Rv. According to an embodiment, the variable power supply voltage PWRv may be a multilevel voltage determined according to the resistance value of the variable sensing resistor Rv.

The host 200 may include the power management module 210, and when the host 200 is electrically connected to the storage device 100D, the power management module 210 may detect the variable detection voltage Vdetv of the detection terminal 121, and provide the variable power supply voltage PWRv determined according to the variable detection voltage Vdetv to the power supply terminal 122. For example, the power management module 210 may be realized as a PMIC.

Figure 15:
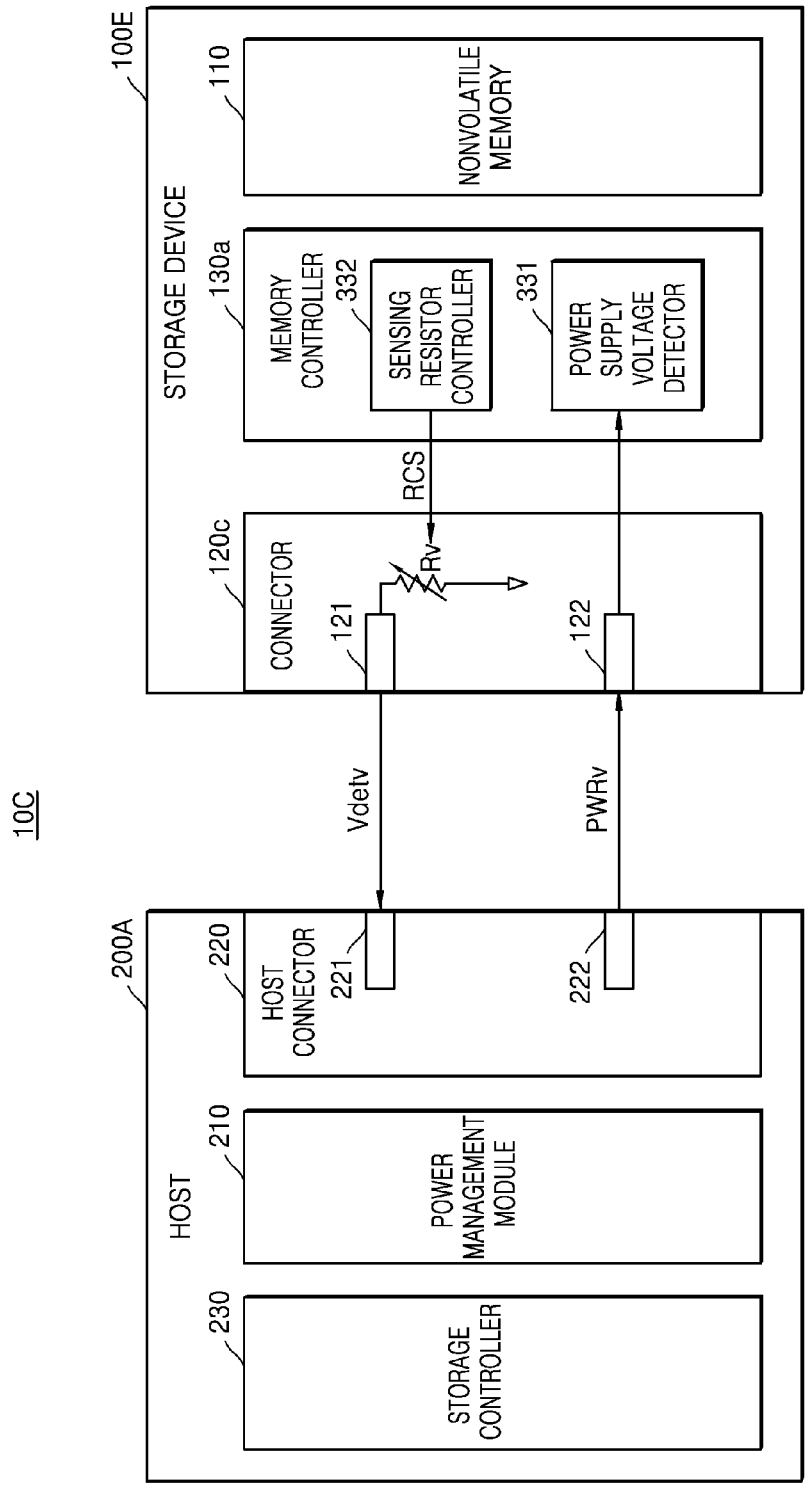
FIG. 15 is a block diagram illustrating in detail a storage system according to an embodiment.

FIG. 15 is a block diagram illustrating a storage system 10C according to an embodiment.

Referring to FIG. 15, the storage system 10C includes a storage device 100E and a host 200A. The storage system 10C combines features previously described in relation to FIGS. 1, 5 and 14.

For example, the host 200A may include the power management module 210, the host connector 220, and the storage controller 230. The host connector 220 may again include first and second connection terminals 221 and 222 connectable to the storage device 100E, where the first connection terminal 221 is electrically connected to the detection terminal 121 of the storage device 100E. Accordingly, the power management module 210 may determine a voltage level of the first connection terminal 221 as the variable detection voltage Vdetv. The second connection terminal 222 may be electrically connected to the power supply terminal 122 of the storage device 100E. Accordingly, the power management module 210 may provide the variable power supply voltage PWRv to the power supply terminal 122 of the storage device 100E through the second connection terminal 222.

The storage controller 230 may select the variable power supply voltage PWRv according to the variable detection voltage Vdetv. As described with reference to FIG. 3, a voltage level of the variable power supply voltage PWRv may change according to a voltage level of the variable detection voltage Vdetv, and the storage controller 230 may control the power management module 210 to provide the variable power supply voltage PWRv selected according to the variable detection voltage Vdetv. However, embodiments are not limited thereto, and a processor of the host 200A may select the variable power supply voltage PWRv according to the variable detection voltage Vdetv. Here, the processor may control the power management module 210 to provide the variable power supply voltage PWRv.

The storage device 100E of FIG. 15 includes the nonvolatile memory 110, the connector 120c, and a memory controller 130a. The memory controller 130a may include a power supply voltage detector 331 and a sensing resistor controller 332. The memory controller 130a may control the nonvolatile memory 110 to read/write data in response to read/write request(s) received from the host 200A. The variable power supply voltage PWRv received from the power supply terminal 122 may be a power supply voltage used in the memory controller 130a.

The power supply voltage detector 331 may be used to detect the variable power supply voltage PWRv to determine whether the variable power supply voltage PWRv received from the power supply terminal 122 corresponds to a target voltage. Also, the power supply voltage detector 331 may transmit a pass/fail signal to the host 200A based on the determination result. However, embodiments are not limited thereto, and another functional block in the memory controller 130a, such as a processor, may receive the result of determining from the power supply voltage detector 331, and transmit a pass signal or a fail signal to the host 200A based on the result.

According to an embodiment, the power supply voltage detector 331 may determine whether the variable power supply voltage PWRv is within an allowable range between a first reference voltage that is less than or equal to a target voltage and a second reference voltage that is greater than or equal to the target voltage. For example, the first reference voltage may be set to (target voltage −0.05 V), and the second reference voltage may be set to (target voltage +0.05 V). Accordingly, an operating error (e.g., a detection error) occurring in the storage device 100E and causing an errant power supply voltage to be applied by the host 200A may be prevented.

The sensing resistor controller 332 may generate the resistance control signal RCS according to a voltage level of a power supply voltage to be received through the power supply terminal 122. A resistance value of the variable sensing resistor Rv may change according to the resistance control signal RCS. The variable detection voltage Vdetv of the detection terminal 121 may increase according to the resistance value of the variable sensing resistor Rv, and the host 200A may provide the variable power supply voltage PWRv to the power supply terminal 122 according to the variable detection voltage Vdetv. Accordingly, the power supply terminal 122 may receive a variable voltage level, and performance of the storage device 100E may increase.

Figure 16:
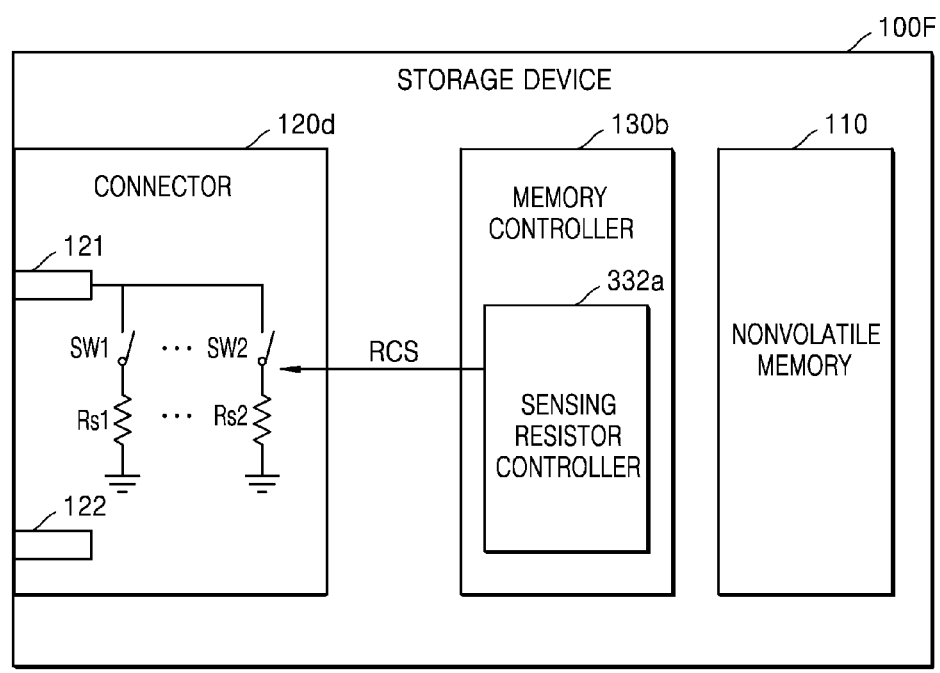
FIG. 16 is a block diagram of a storage device according to an embodiment.

FIG. 16 is a block diagram of a storage device 100F according to an embodiment.

Referring to FIG. 16, the storage device 100F includes the nonvolatile memory 110, a connector 120d, and a memory controller 130b. The storage device 100F is a modified version of the 100E of FIG. 15.

The connector 120d includes the detection terminal 121, the power supply terminal 122, a plurality of sensing resistors (e.g., first and second sensing resistors Rs1 and Rs2), and a plurality of switches (e.g., first and second switches SW1 and SW2). The first switch SW1 and first sensing resistor Rs1 are connected in series between the detection terminal 121 and a ground terminal. The second switch SW2 and second sensing resistor Rs2 are also connected in series between the detection terminal 121 and the ground terminal. The arrangement order of each switch and each resistor connected in series between the detection terminal 121 and the ground terminal may be changed.

The memory controller 130b includes a sensing resistor controller 332a that generates the resistance control signal RCS according to a voltage level of a power supply voltage received through the power supply terminal 122. The first and second switches SW1 and SW2 are turned ON/OFF according to the resistance control signal RCS. Accordingly, resistance values of the first and second sensing resistors Rs1 and Rs2 electrically connected to the detection terminal 121 may change according to the resistance control signal RCS, and thus a detection voltage of the detection terminal 121 may also change.

Hereinafter, operation of the sensing resistor controller 332a shown in FIG. 16 will be described with reference to the table 31 of FIG. 3. For example, the resistance value of the first sensing resistor Rs1 is less than or equal to 0.1 kΩ and the resistance value of the second sensing resistor Rs2 is 10 kΩ. Here, when the voltage level of the power supply voltage to be received through the power supply terminal 122 is 1.2 V, the sensing resistor controller 332a may generate the resistance control signal RCS such that the first switch SW1 is turned on and the second switch SW2 is turned OFF in response to the resistance control signal RCS. Meanwhile, when the voltage level of the power supply voltage to be received through the power supply terminal 122 is 1.1 V, the sensing resistor controller 332a may generate the resistance control signal RCS such that the first switch SW1 is turned OFF and the second switch SW2 is turned ON in response to the resistance control signal RCS.

As such, the connector 320a includes the first and second sensing resistors Rs1 and Rs2 and the first and second switches SW1 and SW2 to control the ON/OFF switching of the first and second switches SW1 and SW2 according to the voltage level of the power supply voltage to be received through the power supply terminal 122. Accordingly, the power supply terminal 122 may receive a variable voltage level, and performance of the storage device 100F may increase.

Figure 17:
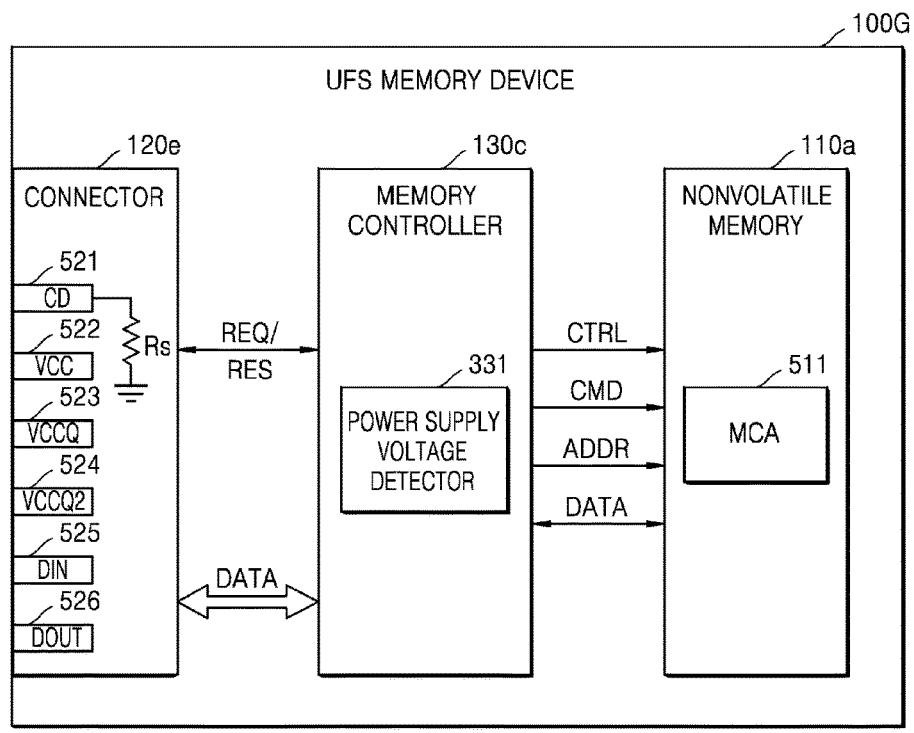
FIG. 17 is a block diagram of a universal flash storage (UFS) memory device according to an embodiment.

FIG. 17 is a block diagram of another storage device 100G realized as a UFS memory device according to an embodiment.

Referring to FIG. 17, the UFS memory device 100G includes a nonvolatile memory 110a, a connector 120e, and a memory controller 130c. The UFS memory device 100G draws upon certain feature previously described in relation to FIGS. 1, 5, 13, 14, 15, and 16.

The nonvolatile memory 110a includes a memory cell array (MCA) 511, where the MCA 511 may include a plurality of memory cells (e.g., flash memory cells). Hereinafter, one or more embodiments are described assuming that the memory cells are NAND flash memory cells. However, embodiments are not limited thereto, and in some embodiments, the memory cells may be resistive memory cells, such as ReRAM, PRAM, or MRAM. According to an embodiment, some of a plurality of memory blocks included in the MCA 511 may be single level cell blocks, and the remaining of the plurality of memory blocks may be multilevel cell blocks or triple level cell blocks.

The MCA 511 may include a 2-dimensional (2D) memory cell array, and the 2D memory cell array may include a plurality of cell strings provided along row and column directions. In some embodiments, the MCA 511 may include a 3D memory cell array, and the 3D memory cell array may include a plurality of NAND strings, wherein each NAND string may include memory cells each connected to word lines stacked vertically on a substrate, which will be described later with reference to FIGS. 18 and 19.

In certain embodiments, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and published U.S. Patent Application No. 2011/0233648.

The connector 120e of FIG. 17 includes a card detection pin 521, a VCC pin 522, a VCCQ pin 523, a VCCQ2 pin 524, a data input pin 525, and a data output pin 526. For example, pins included in the connector 120e may be provided as shown in FIG. 4. However, the pins included in the connector 120e are not limited thereto. For example, the connector 120e may include a plurality of data print pins and a plurality of data output pins. The connector 120e may be a UIC.

Also, the connector 120e may further include the sensing resistor Rs electrically connected to the card detection pin 521. When the UFS memory device 100G is electrically connected to a host, a detection voltage of the card detection pin 521 may have a voltage level determined according to a resistance value of the sensing resistor Rs. According to an embodiment, the resistance value of the sensing resistor Rs may be variously determined according to a type of the UFS memory device 100G, and accordingly, the voltage level of the detection voltage may be variously determined according to a type of the UFS memory device 100G. According to an embodiment, the sensing resistor Rs may be realized as a variable resistor, and a resistance value may change during operations of the UFS memory device 100G. Accordingly, the voltage level of the detection voltage may change during operations of the UFS memory device 100G.

The VCC pin 522 may be electrically connected to the host and receive a VCC voltage from the host. The VCC voltage may be power supply voltage used in the nonvolatile memory 110a (e.g., 3.3 V). The VCCQ pin 523 may be electrically connected to the host and receive a VCCQ voltage from the host. The VCCQ voltage may be a power supply voltage used in the memory controller 130c (e.g., 1.2 V). The VCCQ2 pin 524 may be electrically connected to the host and receive a VCCQ2 voltage from the host. The VCCQ2 voltage may be a power supply voltage used in the memory controller 130c (e.g., 1.8 V).

According to the current embodiment, the VCCQ pin 523 may receive a multilevel power supply voltage from the host. The multilevel power supply voltage may be selected based on a voltage level of the card detection pin 521, which is determined according to the resistance value of the sensing resistor Rs. Accordingly, when a voltage level of a power supply voltage required to operate the UFS memory device 100G is changed, the resistance value of the sensing resistor Rs may be changed, and accordingly, the VCCQ pin 523 may receive a variable power supply voltage. However, embodiments are not limited thereto, and according to some embodiment, the VCC pin 522 and the VCCQ2 pin 524 may also receive a multilevel power supply voltage.

The memory controller 130c may control the nonvolatile memory 110a to read/write data in response to read/write request(s) from the host. For example, the memory controller 130c may control program (or write), read, and erase operations with respect to the nonvolatile memory 110a by providing an address ADDR, a command CMD, and a control signal CTRL to the nonvolatile memory 110a. Also, data DATA for a program operation and data DATA that is read may be exchanged between the memory controller 130c and the nonvolatile memory 110a.

According to the illustrated embodiment of FIG. 17, the memory controller 130c may include a power supply voltage detector 331, where the power supply voltage detector 331 may detect a power supply voltage to determine whether the power supply voltage received from the VCCQ pin 523 corresponds to a target voltage. Also, the power supply voltage detector 331 may transmit a pass/fail signal to the host based on the basis of the determination result. However, embodiments are not limited thereto, and another functional block in the memory controller 130c, for example, a processor, may receive the determination result of the power supply voltage detector 531, and transmit a pass/fail signal to the host.

Figure 18:
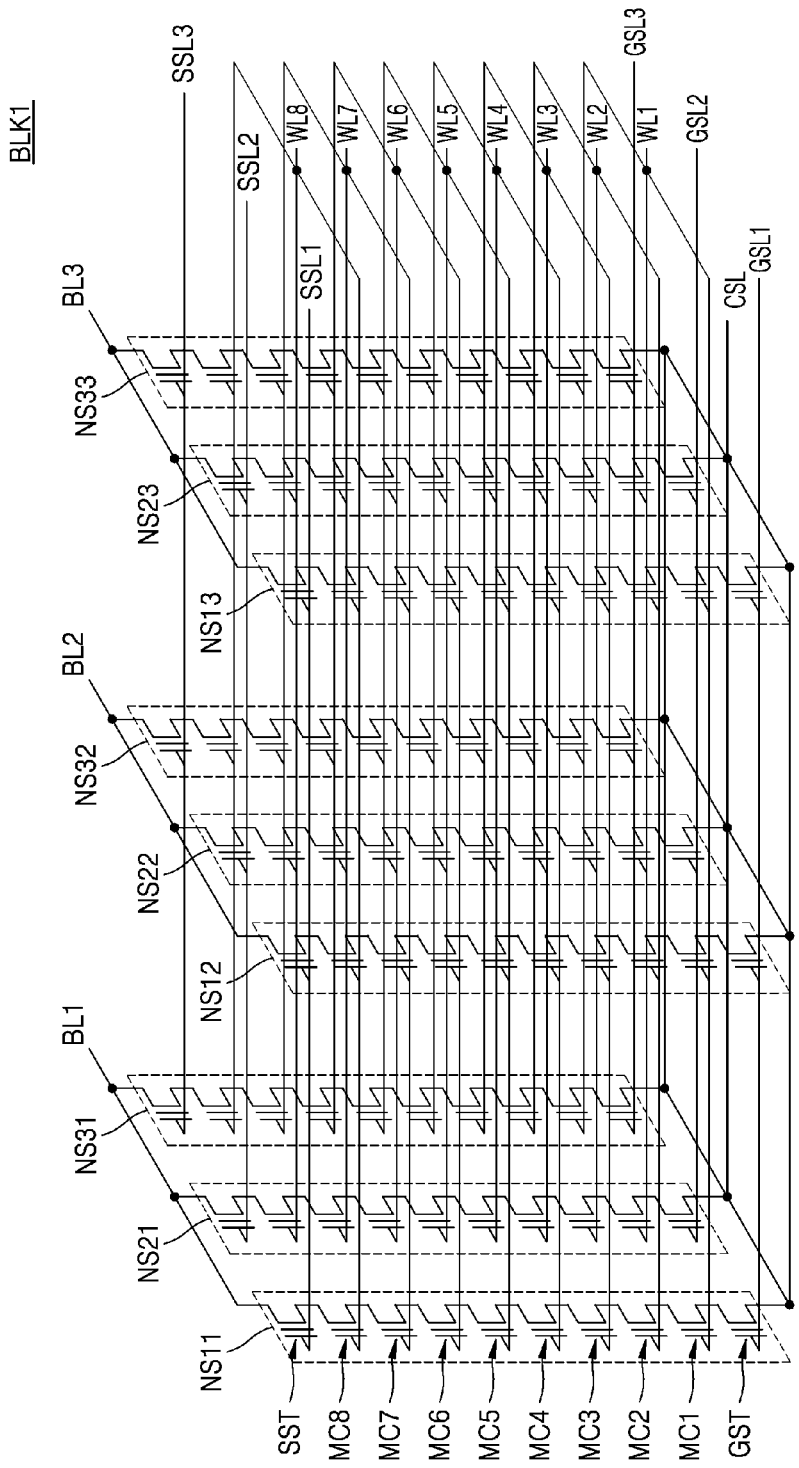
FIG. 18 is a circuit diagram of a memory block included in a memory cell array of FIG. 17.

FIG. 18 is a circuit diagram of a memory block BLK1 included in the MCA 511 of FIG. 17.

Referring to FIG. 18, the MCA 511 may be a memory cell array of a vertical NAND flash memory, and may include a plurality of memory blocks. The memory block BLK1 may include a plurality of NAND strings NS11 through NS33, a plurality of word lines WL1 through WL8, a plurality of first through third bit lines BL1 through BL3, a plurality of ground select lines GSL1 through GSL3, a plurality of first through third string select lines SSL1 through SSL3, and a common source line CSL. Here, the numbers of NAND strings, word lines, bit lines, ground select lines, and string select lines may vary according to embodiments.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each of the NAND strings NS11 through NS33, for example, the NAND string NS11 may include a string select transistor SST, a plurality of memory cells MC1 through MC8, and a ground select transistor GST, which are connected in series. Hereinafter, for convenience of description, the NAND string will be referred to as a string.

Strings commonly connected to one bit line form one column. For example, the strings NS11, NS21, and NS31 commonly connected to the first bit line BL1 correspond to a first column, the strings NS12, NS22, and NS32 commonly connected to the second bit line correspond to a second column, and the strings NS13, NS23, and NS33 commonly connected to the third bit line BL3 correspond to a third column.

Strings connected to one string select line form one row. For example, the strings NS11, NS12, and NS13 connected to the first string select line SSL1 correspond to a first row, the strings NS21, NS22, and NS23 connected to the second string select line SSL2 correspond to a second row, and the strings NS31, NS32, and NS33 connected to the third string select line SSL3 correspond to a third row.

The string select transistor SST is connected to the corresponding first through third string select lines SSL1 through SSL3. The memory cells MC1 through MC8 are respectively connected to the word lines WL1 through WL8. The ground select transistor GST is connected to the corresponding first through third ground select lines GSL1 through GSL3. The string select transistor SST is connected to the corresponding first through third bit lines BL1 through BL3, and the ground select transistor GST is connected to the common source line CSL.

In the current embodiment, word lines at the same height are commonly connected to each other, the first through third string select lines SSL1 through SSL3 are separated from each other, and the grounds select lines GSL1 through GSL3 are separated from each other. For example, when memory cells connected to the word line WL1 and belonging to the strings NS11, NS12, and NS13 are programmed, the word line WL1 and the first string select line SSL1 are selected. However, embodiments are not limited thereto, and the ground select lines GSL1 through GSL3 may be commonly connected to each other.

Figure 19:
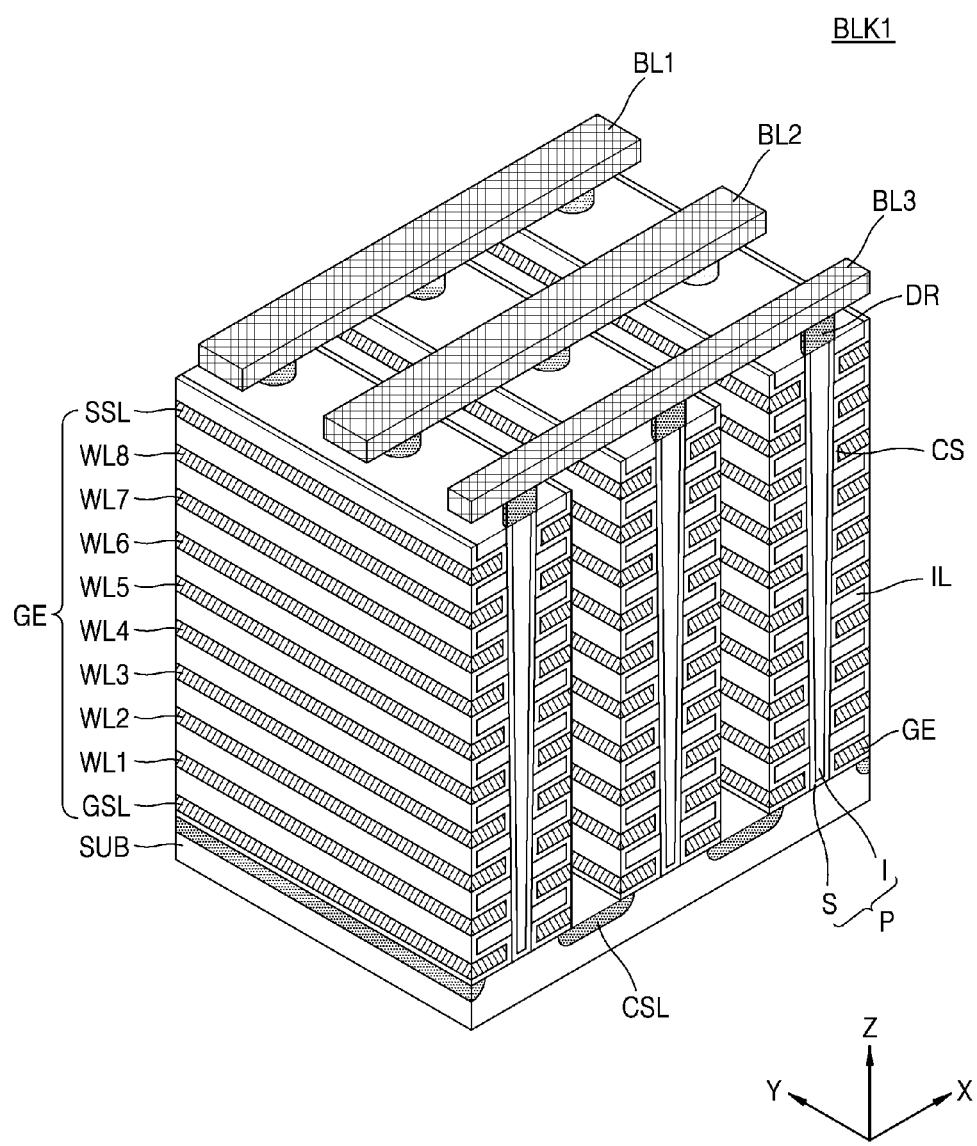
FIG. 19 is a perspective view of the memory block of FIG. 18.

FIG. 19 is a perspective view of the memory block BLK1 of FIG. 18.

Referring to FIG. 19, each memory block included in the MCA 511 is formed in a vertical direction with respect to a substrate SUB. In FIG. 19, the cell block BLK1 includes two select lines GSL and SSL, eight word lines WL1 through WL8, and three bit lines BL1 through BL3, but the numbers of lines are not limited thereto.

The substrate SUB has a first conductive type, for example, a p-type, and a common source line CSL extending along a first direction (for example, a Y-direction) above the substrate SUB and doped with second conductive type (for example, an n-type) impurities are doped is provided. A plurality of insulating layers IL extending along the first direction are provided sequentially along a third direction (for example, a Z-direction) over a region of the substrate SUB between the two adjacent common source lines CSL, wherein the plurality of insulating layers IL are spaced apart from each other by a certain distance along the third direction. The plurality of insulating layers IL may include an insulating material, such as silicon oxide.

A plurality of pillars P sequentially disposed along the first direction and penetrating through the plurality of insulating layers IL along the third direction are provided over the region of the substrate SUB between the two adjacent common source lines CSL. For example, the plurality of pillars P may contact the substrate SUB through the plurality of insulating layers IL. For example, a surface layer S of the pillar P may include a first type silicon material and may function as a channel region. Meanwhile, an inner layer I of the pillar P may include an insulating material, such as silicon oxide, or an air gap.

A charge storage layer CS is provided along exposed surfaces of the insulating layers IL, the pillars P, and the substrate SUB in the region between the two adjacent common source lines CSL. The charge storage layer CS may include a gate insulating layer (also referred to as a tunneling insulating layer), a charge trapping layer, and a blocking insulating layer. For example, the charge storage layer CS may have an oxide-nitride-oxide (ONO) structure. Also, a gate electrode GE like the select lines GSL and SSL and the word lines WL1 through WL8 is provided over the exposed surface of the charge storage layer CS in the region between the two adjacent common source lines CSL.

Drains DR or drain contacts are provided over each of the pillars P. For example, the drains DR or the drain contacts may include an impurity-doped silicon material having the second conductive type. The bit lines BL1 through BL3 extending along a second direction (for example, an X-direction) and spaced apart from each other by a certain distance along the first direction are provided over the drains DR.

Figure 20:
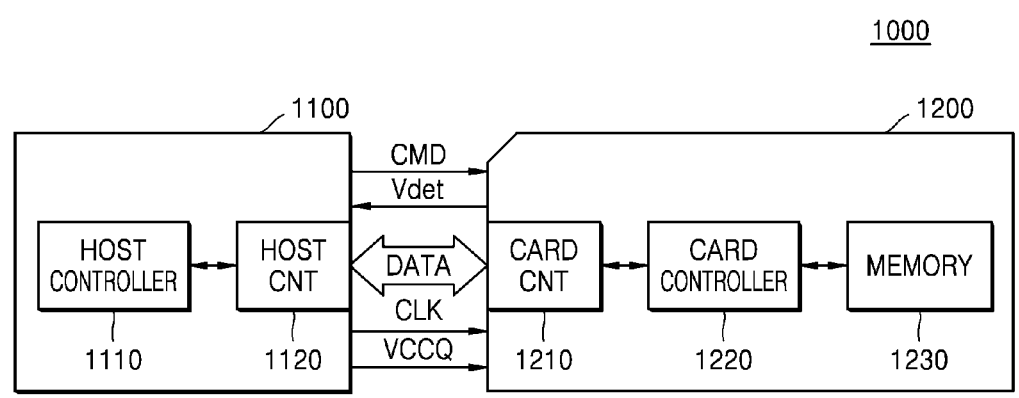
FIG. 20 is a block diagram of a memory card system according to an embodiment.

FIG. 20 is a block diagram of a memory card system 1000 according to an embodiment.

Referring to FIG. 20, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be realized by using the embodiments shown in FIGS. 1 through 19.

The memory card 1200 may be configured to communicate with the host 1100 through at least one of various interface protocols, such as USB, MMC, PCI-E, ATA, SATA, PATA, SCSI, ESDI, and integrated drive electronics (IDE). The memory card 1200 may be realized as a compact flash card (CFC), a micro-drive, a smart media card (SMC), a multimedia card (MMC), a secure digital card (SDC), a memory stick, or a USB flash memory driver.

According to the current embodiment, the card connector 1210 may include a card detection terminal and a power supply terminal, to which a sensing resistor is connected. When the card connector 1210 is electrically connected to the host connector 1120, the card connector 1210 may transmit the detection voltage Vdet that is a voltage of a detection terminal according to a sensing resistor to the host connector 1120. The host controller 1110 may determine a voltage level of a power supply voltage VCCQ to be provided to the memory card 1200 based on the detection voltage Vdet, and the power supply voltage VCCQ may be transmitted from the host connector 1120 to the card connector 1210.

A storage device according to the present embodiment can be implemented as a SSD system. In addition, a memory card, a nonvolatile memory device, and a card controller according to one or more embodiments may be mounted by using various types of a package. For example, a flash memory device, a memory controller, and/or a storage device according to one or more embodiments may be mounted by using any one of packages, such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

While the inventive concept has been particularly shown and described with reference to embodiments thereof, it will be understood that various changes in form and details may be made therein without departing from the scope of the following claims.

What is claimed is:

1. A storage device, comprising:
   a nonvolatile memory;
   a connector configured to connect the storage device to a host, the connector comprising a plurality of separate connection pins and a sensing resistor; and
   a memory controller connected between the connector and the nonvolatile memory,
   wherein the plurality of separate connection pins includes:
      a detection pin that provides a detection voltage to the host, and
      a power supply pin that receives a power supply voltage from the host, wherein the power supply voltage is selected by the host in response to the detection voltage, and
   wherein a sensing resistor is electrically connected to the detection pin and has a resistance value that determines the level of the detection voltage.

2. The storage device of claim 1, wherein the power supply voltage is a multilevel voltage.

3. The storage device of claim 1, wherein the sensing resistor is a variable resistor.

4. The storage device of claim 3, wherein the resistance value of the variable resistor varies during an operation of the storage device.

5. The storage device of claim 1, wherein the memory controller is configured to control operation of the nonvolatile memory and includes a power supply voltage detector, and wherein the power supply voltage detector is configured to detect the power supply voltage received from the host, determine whether the power supply voltage corresponds to a target voltage, and provide a pass signal to the host if the power supply voltage corresponds to the target voltage, else provide fail signal to the host.

6. The storage device of claim 5, wherein the power supply voltage detector determines whether the power supply voltage corresponds to the target voltage by determining whether the power supply voltage falls within an allowable range defined around the target voltage.

7. The storage device of claim 6, wherein the power supply voltage detector comprises:
   a first power supply voltage detector that determines whether the power supply voltage is greater than or equal to a first reference voltage; and
   a second power supply voltage detector that determine whether the power supply voltage is less than or equal to a second reference voltage level,
   wherein the first reference voltage is set to be less than or equal to the target voltage and the second reference voltage level is set to be greater than or equal to the target voltage.

8. The storage device of claim 1, wherein the connector further comprises a switch connected in parallel with the sensing resistor, and
   wherein the memory controller is configured to control operation of the nonvolatile memory and includes a sensing resistor controller, and
   wherein the sensing resistor controller is configured to generate a resistance control signal in response to the power supply voltage and the resistance control signal controls switching of the switch.

9. The storage device of claim 8, wherein the resistance control signal switches the switch ON when the power supply voltage is at least a default voltage level, and switches the switch OFF when the power supply voltage is not at least the default voltage level.

10. The storage device of claim 1, wherein the sensing resistor is a variable resistor,
    wherein the memory controller is configured to control operation of the nonvolatile memory and includes a sensing resistor controller, and
    wherein the sensing resistor controller is configured to generate a resistance control signal that adjusts the resistance value of the sensing resistor.

11. The storage device of claim 10, wherein the memory controller further comprises:
    a power supply voltage detector, wherein the power supply voltage detector is configured to detect the power supply voltage received from the host, determine whether the power supply voltage corresponds to a target voltage, and provide a pass signal to the host if the power supply voltage corresponds to the target voltage, else provide fail signal to the host.

12. The storage device of claim 11, wherein the power supply voltage detector determines whether the power supply voltage corresponds to the target voltage by determining whether the power supply voltage falls within an allowable range defined around the target voltage.

13. The storage device of claim 1, wherein the connector further comprises:
    a first switch and a first resistor series connected between the detection pin and a ground pin; and
    a second switch and a second resistor series connected between the detection pin and the ground pin,
    wherein the memory controller is configured to control operation of the nonvolatile memory and includes a sensing resistor controller, and
    wherein the sensing resistor controller is configured to generate a resistance control signal that controls the switching of the first switch and second switch.

14. The storage device of claim 1, wherein the storage device is a Universal Flash Storage (UFS) device, the detection pin is a card detection pin, the power supply pin is a VCCQ pin, and the power supply voltage has a level less than or equal to 1.2 V.

15. A host communicating with a storage device, the host comprising a power management module configured to provide a power supply voltage to the storage device, wherein the power management module comprises:
    a voltage detector configured to detect a level of a detection voltage provided by a detection pin of the storage device; and
    a power supply voltage provider configured to provide the power supply voltage to a power supply pin of the storage device to power the storage device,
    wherein a level of the power supply voltage is determined in response to the level of the detection voltage, and wherein the detection pin and the power supply voltage pin are separate from each other.

16. The host of claim 15, wherein the power supply voltage is a multilevel power supply voltage.

17. The host of claim 15, wherein the power management module is further configured to vary the level of the power supply voltage in real-time according to the level of the detection voltage.

18. The host of claim 15, further comprising a storage controller configured to control operation of the power management module in response to a pass/fail signal provided by the storage device in response to the power supply voltage.

19. The host of claim 18, wherein the storage controller and power management module are embodied as a system-on-chip (SoC).

20. A storage system, comprising:
a storage device comprising a plurality of separate connection pins and a sensing resistor, the plurality of separate connection pins including a detection pin providing a detection voltage, and a power supply pin receiving a power supply voltage for powering the storage device, and the sensing resistor being electrically connected to the detection pin and having a resistance value; and
a host connected to the storage device and configured to provide the power supply voltage having a level selected in response to a level of the detection voltage,
wherein the level of the detection voltage is controlled by the resistance value of the sensing resistor.

* * * * *